United States Patent
Sung et al.

(10) Patent No.: US 10,951,445 B2
(45) Date of Patent: Mar. 16, 2021

(54) RADIO FREQUENCY INTEGRATED CIRCUIT SUPPORTING CARRIER AGGREGATION AND WIRELESS COMMUNICATION DEVICE INCLUDING THE SAME

(71) Applicant: SAMSUNG ELECTRONICS CO., LTD., Suwon-si (KR)

(72) Inventors: Barosaim Sung, Daejeon (KR); Chilun Lo, Seongnam-si (KR); Jae-hoon Lee, Suwon-si (KR); Jong-woo Lee, Seoul (KR); Seung-hyun Oh, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 10 days.

(21) Appl. No.: 16/191,611

(22) Filed: Nov. 15, 2018

(65) Prior Publication Data

US 2019/0165975 A1 May 30, 2019

(30) Foreign Application Priority Data

Nov. 27, 2017 (KR) .................. 10-2017-0159682
Jul. 17, 2018 (KR) .................. 10-2018-0083140

(51) Int. Cl.
| | | |
|---|---|---|
| H03D 3/02 | (2006.01) |
| H04L 27/227 | (2006.01) |
| H04B 1/403 | (2015.01) |
| H03G 3/30 | (2006.01) |
| H04L 27/38 | (2006.01) |
| H04L 5/00 | (2006.01) |

(52) U.S. Cl.
CPC ....... *H04L 27/2272* (2013.01); *H03G 3/3042* (2013.01); *H04B 1/403* (2013.01); *H04L 27/38* (2013.01); *H04L 5/001* (2013.01)

(58) Field of Classification Search
CPC ..... H04L 27/2272; H04L 27/38; H04L 5/001; H03G 3/3042; H04B 1/403
USPC ........................................................ 329/307
See application file for complete search history.

(56) References Cited

U.S. PATENT DOCUMENTS

| | | | |
|---|---|---|---|
| 7,310,386 B2 | 12/2007 | Jensen et al. |
| 7,515,929 B2 | 4/2009 | Ramachandran et al. |
| 7,522,901 B2 | 4/2009 | Dauphinee |
| 9,356,810 B2 | 5/2016 | Igarashi et al. |
| 2005/0254561 A1* | 11/2005 | Seo ...................... H04B 1/0003 |
| | | | 375/219 |
| 2009/0135970 A1 | 5/2009 | Miyagi et al. |
| 2009/0290659 A1* | 11/2009 | Petrovic ................. H04H 20/30 |
| | | | 375/340 |
| 2010/0215124 A1 | 8/2010 | Zeong et al. |
| 2011/0194658 A1 | 8/2011 | Han |

(Continued)

Primary Examiner — Richard Tan
(74) Attorney, Agent, or Firm — Sughrue Mion, PLLC

(57) ABSTRACT

A radio frequency (RF) integrated circuit is provided. The RF integrated circuit supports carrier aggregation and includes first receiving circuits and a first shared phase locked loop circuit that provides a first frequency signal of a first frequency to the first receiving circuits. One of the first receiving circuits includes an analog to digital converter (ADC) and a digital conversion circuit. The ADC converts an RF signal received by the one of the first receiving circuits to a digital signal by using the first frequency signal. The digital conversion circuit generates a digital baseband signal by performing frequency down conversion on the digital signal.

18 Claims, 24 Drawing Sheets

(56) References Cited

U.S. PATENT DOCUMENTS

| | | | |
|---|---|---|---|
| 2012/0146852 A1* | 6/2012 | Park | G01S 7/292 |
| | | | 342/385 |
| 2014/0210536 A1* | 7/2014 | Kurchuk | H03K 5/1252 |
| | | | 327/292 |
| 2016/0094249 A1* | 3/2016 | Naeini | H04B 1/006 |
| | | | 455/189.1 |
| 2016/0294591 A1* | 10/2016 | Kurchuk | H04B 1/06 |
| 2017/0302342 A1* | 10/2017 | Kurchuk | H04B 7/0452 |
| 2018/0045818 A1* | 2/2018 | Majumdar | G01S 17/931 |

\* cited by examiner

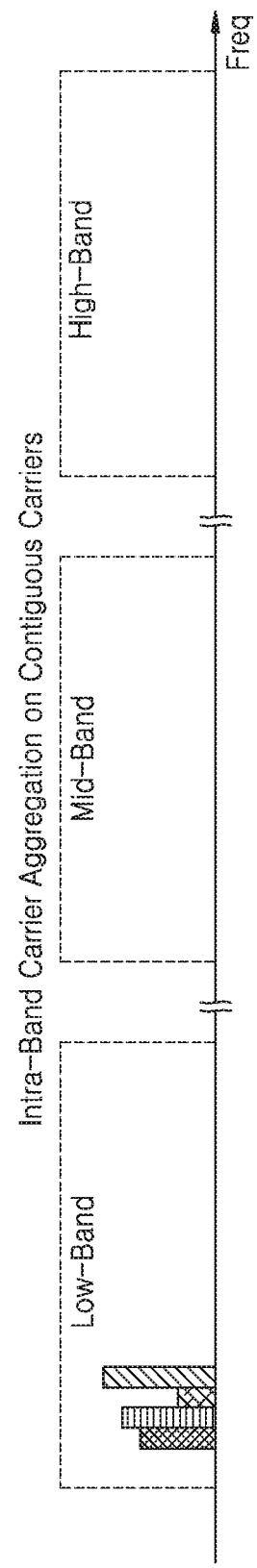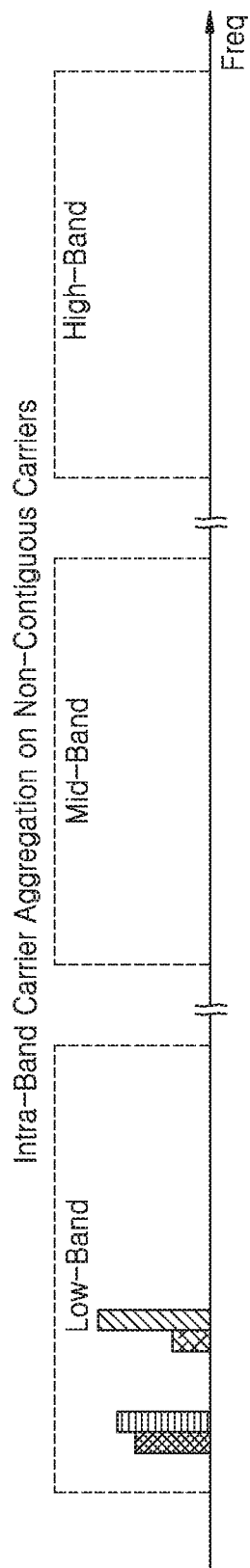

RADIO FREQUENCY INTEGRATED CIRCUIT SUPPORTING CARRIER AGGREGATION AND WIRELESS COMMUNICATION DEVICE INCLUDING THE SAME

CROSS-REFERENCE TO RELATED APPLICATIONS

This application claims priority from Korean Patent Application Nos. 10-2017-0159682 and 10-2018-0083140, respectively filed on Nov. 27, 2017 and Jul. 17, 2018, in the Korean Intellectual Property Office, the disclosures of each of which are incorporated by reference herein in their entirety.

BACKGROUND

1. Field

Apparatuses, devices, and articles of manufacture consistent with the present disclosure relate to radio frequency (RF) integrated circuit supporting carrier aggregation, and more particularly, to an RF integrated circuit transmitting and receiving RF signals.

2. Description of the Related Art

A wireless communication device may modulate data and transmit a radio frequency (RF) signal to a wireless communication network by loading the RF signal on a certain carrier. In addition, the wireless communication device may receive the RF signal from the wireless communication network, amplify the received RF signal, and demodulate the amplified RF signal. To transmit and receive more data, the wireless communication device may support carrier aggregation, that is, transceiving the RF signal modulated into multiple carriers.

SUMMARY

It is an aspects to provide a radio frequency (RF) integrated circuit capable of reducing a design area thereof, supporting carrier aggregation, and efficiently consuming electric power in a communication operation, and a wireless communication device including the RF integrated circuit.

According to an aspect of an example embodiment, there is provided a radio frequency (RF) integrated circuit configured to support carrier aggregation, the RF integrated circuit comprising a plurality of first receiving circuits; and a first shared phase locked loop circuit configured to provide a first frequency signal of a first frequency to the plurality of first receiving circuits, wherein one of the plurality of first receiving circuits comprises an analog to digital converter (ADC) configured to convert an RF signal received by the one of the plurality of first receiving circuits to a digital signal by using the first frequency signal; and a digital conversion circuit configured to generate a digital baseband signal by performing frequency down conversion on the digital signal.

According to another aspect of an example embodiment, there is provided a wireless communication device configured to support carrier aggregation, the wireless communication device comprising a radio frequency (RF) integrated circuit comprising a plurality of receiving circuits configured to receive an RF signal; and a shared phase locked loop circuit configured to provide to the plurality of receiving circuits a frequency signal of a certain frequency for an analog to digital conversion; and a modem configured to provide, to the RF integrated circuit, a digital reference signal for frequency down conversion of the RF signal.

According to another aspect of an example embodiment, there is provided a non-transitory processor readable storage medium comprising commands, which, when executed by a processor inside a wireless communication device comprising a plurality of receiving circuits that share one phase locked loop circuit, the non-transitory processor is configured to provide, to the plurality of receiving circuits, a digital-reference signal for a frequency down conversion of a radio frequency (RF) signal received by the plurality of receiving circuits based on a frequency channel corresponding to the RF signal, and to provide to the plurality of receiving circuits a signal for adjusting a sampling rate at a time of an analog to digital conversion performed by the plurality of receiving circuits based on a band group corresponding to the RF signal.

BRIEF DESCRIPTION OF THE DRAWINGS

Example embodiments will be more clearly understood from the following detailed description taken in conjunction with the accompanying drawings in which:

FIGS. 2A through 2D and 3A and 3B are diagrams for explaining technology for carrier aggregation (CA), according to example embodiments;

DETAILED DESCRIPTION

In general, a wireless communication device for supporting the carrier aggregation may include the RF integrated circuit (or an RF front-end module), wherein the RF integrated circuit includes a plurality of receiving circuits (or receivers) that receive the RF signals and a plurality of transmitting circuits (or transmitters) that transmit the RF signals.

Each of the receiving circuits may individually have a hardware configuration of a local oscillator which generates a frequency signal used for a frequency down conversion of the RF signal. Due to such configuration, it has been difficult to reduce a design area of the receiving circuit, and since the wireless communication device requires a large number of local oscillators, power consumed by the local oscillators is significant, and an efficient utilization of power at the time of a communication operation of the wireless communication device is difficult.

Hereinafter, example embodiments are described in detail with reference to the accompanying drawings.

Figure 1:
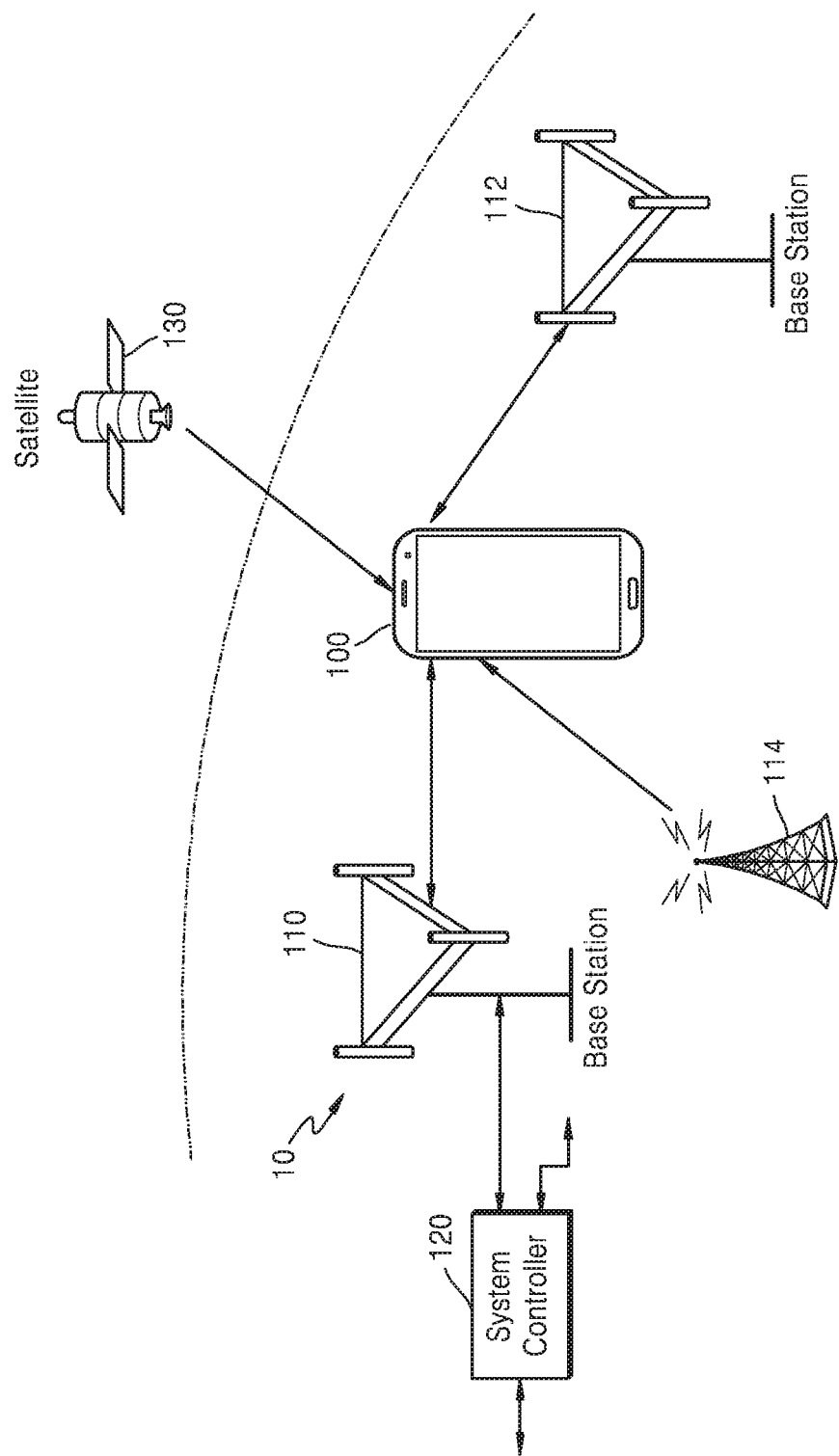
FIG. 1 illustrates a wireless communication device performing wireless communication operations and a wireless communication system including the same, according to an example embodiment.

FIG. 1 illustrates a wireless communication device 100 performing wireless communication operations and a wireless communication system 10 including the same.

Referring to FIG. 1, the wireless communication system 10 may be any one of a long term evolution (LTE) system, a code division multiple access (CDMA) system, a global system for mobile communications (GSM) system, and a wireless local area network (WLAN) system, etc. In addition, the CDMA system may also be implemented in various CDMA versions such as wideband CDMA (WCDMA), time division synchronous CDMA (TD-SCDMA), and CDMA2000.

The wireless communication system 10 may include at least two base stations 110 and 112 and a system controller 120. However, the example embodiment is not limited thereto, and the wireless communication system 10 may include a plurality of base stations and a plurality of network entities. The wireless communication device 100 may be referred to as user equipment (UE), a mobile station (MS), a mobile terminal (MT), a user terminal (UT), a subscriber station (SS), a mobile device, etc. The base stations 110 and 112 may be referred to as fixed stations that communicate with the wireless communication device 100 and/or other base stations, and the base stations 110 and 112 may communicate with the wireless communication device 100 and/or other base stations to transceive radio frequency (RF) signals including control information. Each of the base stations 110 and 112 may be referred to as a Node B, an evolved Node B (eNB), a base transceiver system (BTS), an access point (AP), etc.

The wireless communication device 100 may communicate with the wireless communication system 10 and may receive signals from a broadcast station 114. Further, the wireless communication device 100 may receive signals from a satellite 130 of a global navigation satellite system (GNSS). The wireless communication device 100 may support radio technology for wireless communication (for example, LTE, CDMA2000, WCDMA, TD-SCDMA, GSM, 802.11, etc.).

The wireless communication device 100 may support carrier aggregation for performing transceiving operations by using a plurality of carriers. The wireless communication device 100 may perform wireless communication with the wireless communication system 10 in a low band, a mid band, and a high band. Each of the low band, the mid band, and the high band may be referred to as a band group, and each band group may include a plurality of frequency bands. The band group may be variably determined according to a communication standard or a communication infrastructure, and the band group may be determined more finely or roughly than the above-described low band, mid band, and high band. That is, low band, mid band, and high band are merely examples. In addition, a bandwidth of the frequency band included in each band group may vary according to the communication standard or the communication infrastructure.

For example, in LTE, one frequency band may cover up to about 20 MHz. The carrier aggregation (hereinafter, referred to as CA) may be classified into an intra-band CA and an inter-band CA. The intra-band CA may refer to performing the wireless communication operation by using a plurality of carriers in the same frequency band, and the inter-band CA may refer to performing the wireless communication operation by using a plurality of carriers in different frequency bands.

An RF integrated circuit of the wireless communication device 100 according to an example embodiment may include a plurality of receiving circuits for receiving an RF signal, and at least two receiving circuits among the receiving circuits may share one phase locked loop circuit that generates a frequency signal used for an analog to digital conversion operation for the RF signal. In addition, each receiving circuit may include a digital conversion circuit that frequency down converts the RF signal (i.e., that performs a frequency down conversion of the RF signal), and the digital conversion circuit may receive the RF signal converted to a digital signal and perform the frequency down conversion on the RF signal. The digital conversion circuit may receive a digital reference signal used for performing the frequency down conversion from a modulator demodulator (modem) of the wireless communication device 100.

In addition, the RF integrated circuit of the wireless communication device 100 may include a plurality of transmitting circuits for transmitting the RF signals, and at least two transmitting circuits among the transmitting circuits may share one phase locked loop circuit generating a frequency signal used for the digital to analog conversion operation of the RF signals. In addition, each of the transmitting circuits may include a digital conversion circuit that frequency up converts the RF signal (i.e., performing a frequency up conversion of the RF signal), and the digital conversion circuit may receive a digital baseband signal from the modem and perform the frequency up conversion for the digital baseband signal. The digital conversion circuit may receive the digital reference signal used for performing the frequency up conversion from the modem of the wireless communication device 100.

Further, the receiving circuits and the transmitting circuits of the RF integrated circuit of the wireless communication device 100 may be implemented to share one phase locked loop circuit, and particular example embodiments in which the phase locked loop circuit is shared are described with reference to FIG. 6A and the like.

FIGS. 2A through 2D and 3A and 3B are diagrams for explaining technology for the CA.

FIG. 2A is an example diagram of a contiguous intra-band CA. Referring to FIG. 2A, the wireless communication device 100 in FIG. 1 may transceive signals by using four contiguous carriers in the same frequency band in the low-band.

FIG. 2B is an example diagram of a non-contiguous intra-band CA. Referring to FIG. 2A, the wireless communication device 100 may transceive signals by using four contiguous carriers in the same frequency band in the low-band. The frequency band may include a plurality of frequency channels, and the four contiguous carriers may correspond to respectively different frequency channels. A degree to which carriers are spaced apart from each other may be, for example, about 5 MHz, about 10 MHz, or another amount.

Figure 2C:
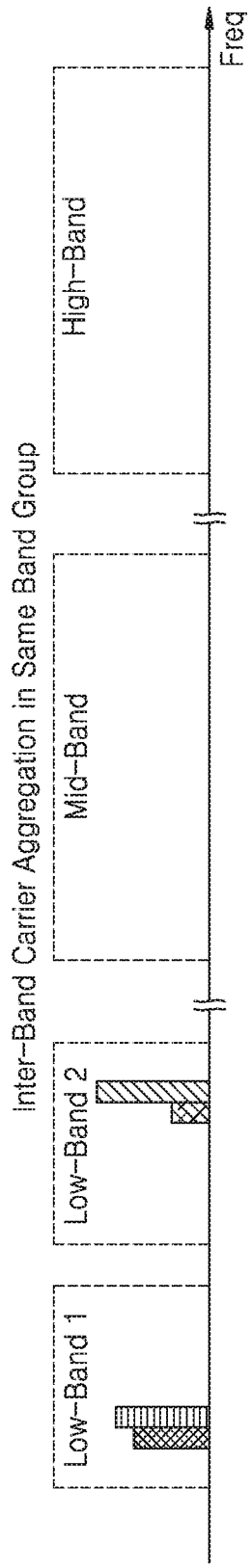

FIG. 2C is an example diagram of the inter-band CA in the same band group. Referring to FIG. 2C, the wireless communication device 100 may perform transceiving of signals by using four carriers corresponding to the frequency channels in two frequency bands (that is, low-band 1 and low-band 2) included in the same band group (that is, the low-band).

Figure 2D:
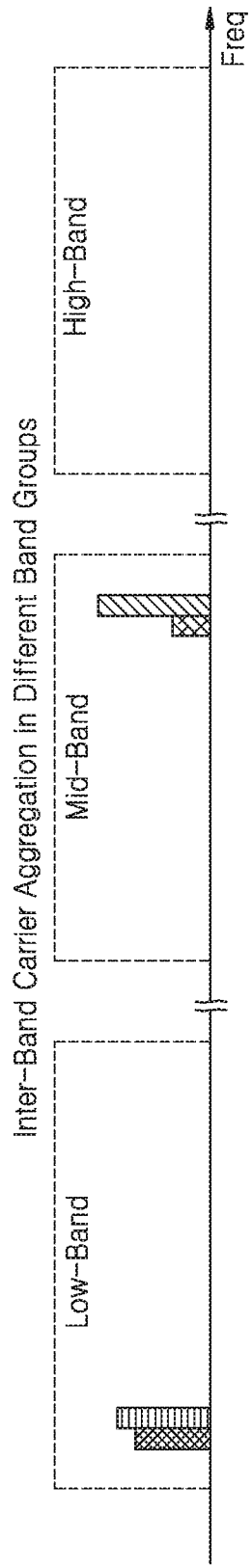

FIG. 2D is an example diagram of the inter-band CA in different band groups. Referring to FIG. 2D, the wireless communication device 100 may perform transceiving of signals by using four carriers corresponding to the frequency channels in the different band groups. Two carriers may correspond to the frequency channels in any one frequency band included in the low-band, and the other two carriers may correspond to the frequency channels in any one frequency band included in the mid-band.

The CAs illustrated in FIGS. 2A through 2D are not limited to these examples, and the wireless communication device 100 may support various combinations of CAs for the frequency bands or the band groups. Additionally, the CAs illustrated in FIGS. 2A through 2D show four carriers, but the specific number of carriers is not limited and may be less than or greater than the four carriers that are illustrated.

Figure 3A:
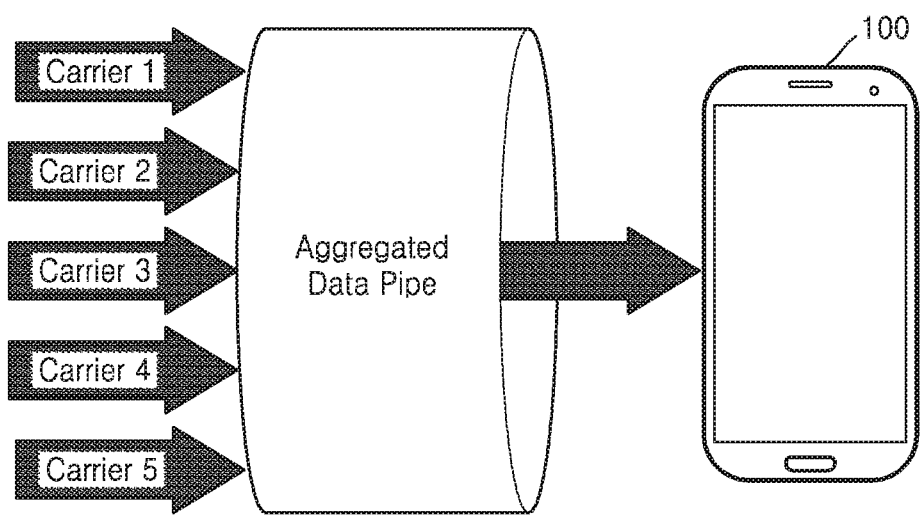

Referring to FIG. 3A, new technology for the CA has emerged that combines and operates multiple frequency bands at one or more base stations to meet the demand for an increased bit rate. LTE, one of the mobile networks, may realize a data transmission speed of about 100 Mbps, and thus, large capacity videos may be smoothly transceived in a wireless environment. FIG. 3A illustrates an example in which the data transmission speed is increased up to about 5 times by combining five frequency bands in the LTE standard by the CA technology. Since each carrier in FIG. 3A are carriers defined by LTE, and one frequency bandwidth is defined up to about 20 MHz in the LTE standard, the wireless communication device 100 according to an example embodiment may improve a data rate to a maximum bandwidth of about 100 MHz.

Figure 3B:
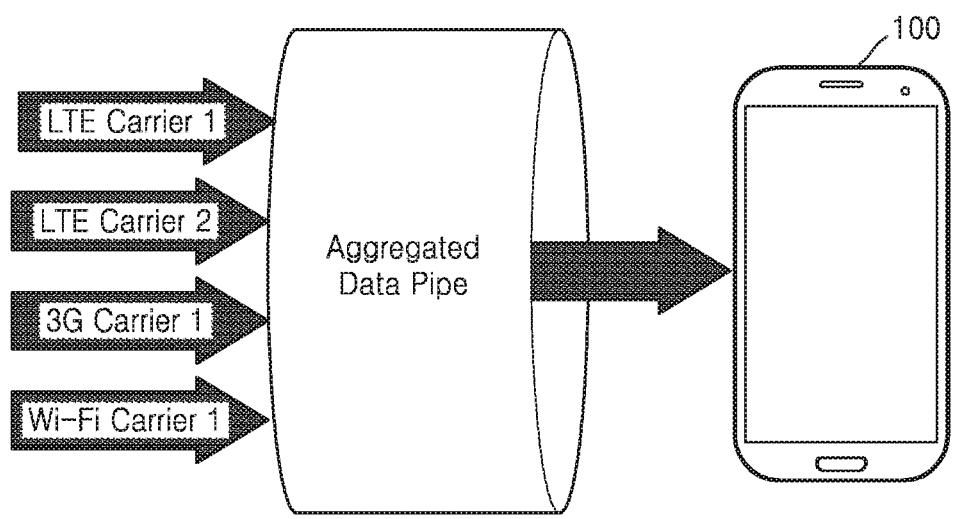

Although FIG. 3A illustrates an example in which only carriers defined by LTE are combined, the example embodiment is not limited thereto. As illustrated in FIG. 3B, carriers of different wireless communication networks may also be combined. Referring to FIG. 3B, since the frequency bands are combined by the CA technology, the frequency bands in not only the LTE standard but also the 3G and Wi-fi standards may be combined. In a similar manner, LTE advanced (LTE-A) may perform much faster data transmission by adopting the CA technology.

Figure 4:
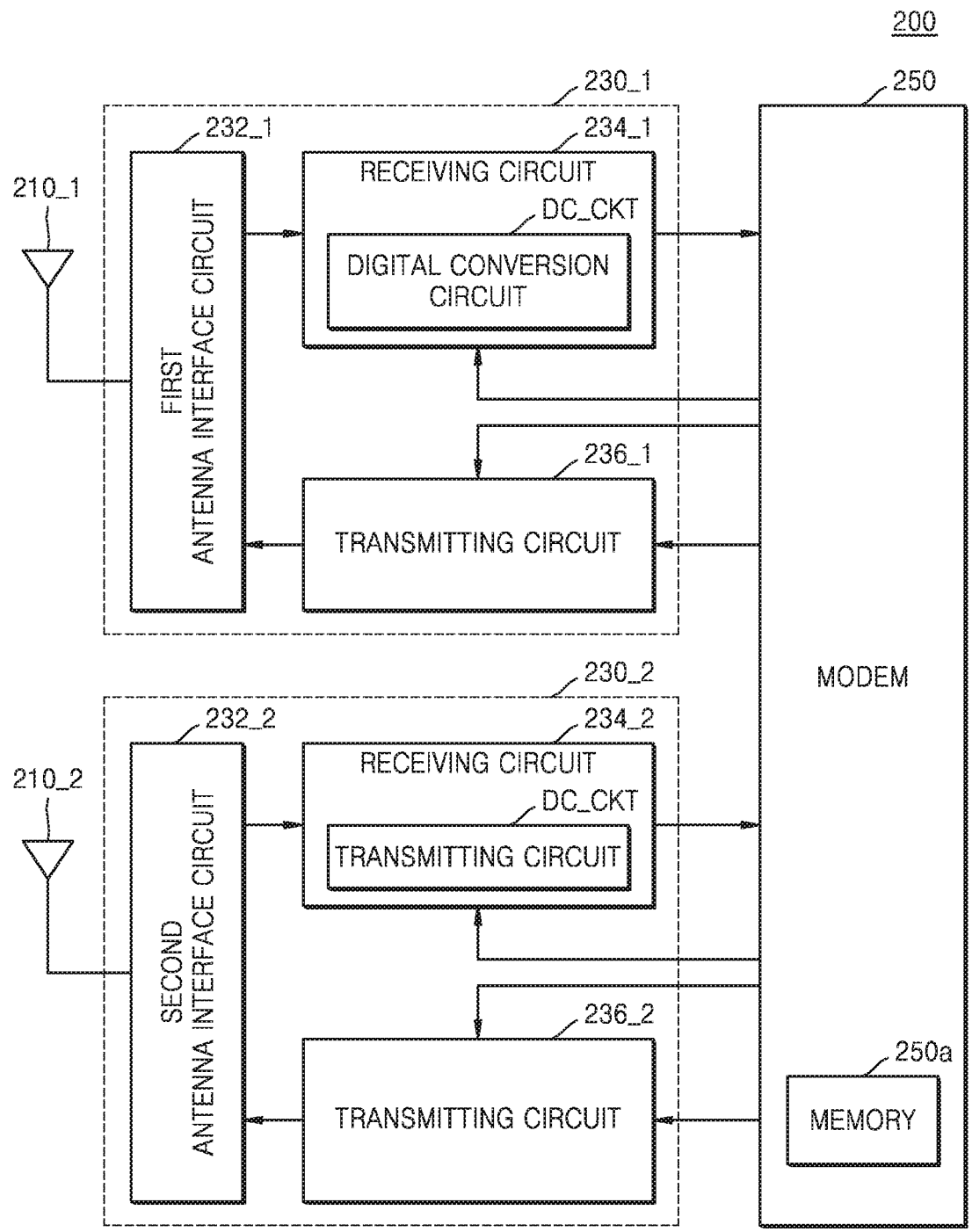
FIG. 4 is a block diagram illustrating a wireless communication device according to an example embodiment.

FIG. 4 is a block diagram illustrating a wireless communication device 200 according to an example embodiment.

Referring to FIG. 4, the wireless communication device 200 may include a first transceiving circuit (or a transceiver) 230_1 connected to a primary antenna 210_1, a second transceiving circuit 230_2 connected to a secondary antenna 210_2, and a modem (or a baseband processor) 250. The first transceiving circuit 230_1 may include a first antenna interface circuit 232_1, a receiving circuit 234_1, and a transmitting circuit 236_1. The second transceiving circuit 230_2 may include a second antenna interface circuit 232_2, a receiving circuit 234_2, and a transmitting circuit 236_2. In FIG. 4, each of the first and second transceiving circuits 230_1 and 230_2 is illustrated as including one of the receiving circuits 234_1 and 234_2 and one of the transmitting circuits 236_1 and 236_2, respectively, but this is only an example embodiment. The example embodiment is not limited thereto, and the first and second transceiving circuits 230_1 and 230_2 may further include a plurality of receiving circuits and a plurality of transmitting circuits, respectively.

The first and second transceiving circuits 230_1 and 230_2 may support a plurality of frequency bands, a plurality of radio technologies, CA, receiving diversity, a multiple-input multiple-out (MIMO) transmission between a plurality of transmitting antennas and a plurality of receiving antennas, etc.

The receiving circuits 234_1 and 234_2 may include a low noise amplifier, an analog to digital converter (ADC), and a digital conversion circuit DC_CKT. Configurations of the receiving circuits 234_1 and 234_2 may be applied to other receiving circuits included in the wireless communication device 200. Hereinafter, an operation of the first transceiving circuit 230_1 is described, and the example embodiment of the first transceiving circuit 230_1 may be applied to the second transceiving circuit 230_2.

For receiving data, the primary antenna 210_1 may receive the RF signal from the base stations 110 and 112 or the like. The first antenna interface circuit 232_1 may route the RF signal to a selected receiving circuit 234_1. The first antenna interface circuit 232_1 may include a duplexer, a filter circuit, an input matching circuit, etc.

The receiving circuit 234_1 according to an example embodiment may filter the received RF signal such that only a signal component corresponding to a certain band group (or a certain frequency band) passes therethrough and may perform an operation (or analog to digital conversion (ADC)) in which the filtered RF signal is converted into a digital signal. In addition, the digital conversion circuit DC_CKT may receive the digital reference signal from the modem 250, and based on the received digital reference signal, may perform the frequency down conversion on the RF signal that has been converted into the digital signal. Since the receiving circuit 234_1 includes the digital conversion circuit DC_CKT, a hardware configuration of the local oscillator for generating a frequency signal, which has a variable frequency according to the frequency channel corresponding to the RF signal received by the receiving circuit 234_1, may not be needed. Accordingly, a size of the receiving circuit 234_1 may be reduced, and as a result, the design efficiency of the RF integrated circuit including the receiving circuit 234_1 may be increased. The receiving circuit 234_1 may provide the digital baseband signal generated through the frequency down conversion to the modem 250, and the modem 250 may process the digital baseband signal to generate the data signal.

In addition, in some example embodiments, the plurality of receiving circuits in the first transceiving circuit 230_1 including the receiving circuit 234_1 may share the phase locked loop circuit. In some example embodiments, the phase locked loop circuit may generate the frequency signal used for analog to digital conversion and provide the generated frequency signal to the plurality of receiving circuits that share the phase locked loop circuit. Since the receiving circuits sharing the phase locked loop circuit collectively receive the frequency signals having the same frequency, a division operation for the frequency signals may be used such that each of the receiving circuits acquires the frequency signal having a target frequency. In some example embodiments, the modem 250 may control the division operation for the frequency signal of the phase locked loop circuit such that each of the receiving circuits acquires the frequency signal having the target frequency, and the receiving circuit may perform the analog to digital conversion operation by using the frequency signal having the target frequency. Detailed example embodiments on this matter are described later with reference to FIGS. 8A through 8B, 10, 13, and the like.

In some example embodiments, a plurality of receiving circuits 234_2 in the second transceiving circuit 230_2 may share a phase locked loop circuit which is different from the phase locked loop circuit shared by the plurality of receiving circuits 234_1 in the first transceiving circuit 230_1. In other words, the wireless communication device 200 may be implemented with a structure in which the first and second transceiving circuits 230_1 and 230_2 each individually share different phase locked loop circuits of their own. In another example embodiment, the plurality of receiving circuits 234_1 in the first transceiving circuit 230_1 and the plurality of receiving circuits 234_2 in the second transceiving circuit 230_2 may share one phase locked loop circuit. In other words, the wireless communication device 200 may be implemented with a structure in which the first and second transceiving circuits 230_1 and 230_2 share one phase locked loop circuit. Furthermore, it may be implemented that a plurality of receiving circuits in the first and second transceiving circuits 230_1 and 230_2 are grouped and the receiving circuits in the groups share different phase locked loop circuits from each other. However, the above example embodiments are only illustrative, and example embodiments of the receiving circuits 234_1 and 234_2 sharing the phase locked loop circuit may be variously implemented.

The transmitting circuits 236_1 and 236_2 may include a power amplifier, a digital to analog converter (DAC), and a digital conversion circuit (not illustrated). Configurations of the transmitting circuits 236_1 and 236_2 may be applied to other transmitting circuits included in the wireless communication device 200.

The digital conversion circuit of the transmitting circuit 236_1 may receive the digital reference signal and the digital baseband signal from the modem 250 and perform the frequency up conversion for the digital baseband signal based on the digital reference signal. Thereafter, the DAC of the transmitting circuit 236_1 may convert the digital baseband signal of the RF band into a digital RF signal, and the power amplifier of the transmitting circuit 236_1 may amplify the RF signal to have an appropriate output power level. The transmitting circuit 236_1 may provide the amplified RF signal to the primary antenna 210_1 via the first antenna interface circuit 232_1, and the primary antenna 210_1 may transmit the amplified RF signal to the base stations 110 and 112, etc.

An example embodiment similar to the example embodiment in which the receiving circuits 234_1 and 234_2 share the phase locked loop circuit may also be applied to the transmitting circuits 236_1 and 236_2, and a phase locked loop circuit shared by the transmitting circuits 236_1 and 236_2 may be the same as or different from the phase locked loop circuits shared by the receiving circuits 234_1 and 234_2. Hereinafter, a phase locked loop circuit shared by a plurality of receiving circuits or a plurality of transmitting circuits may be referred to as a shared phase locked loop circuit.

The modem 250 may generate the data signal by demodulating the baseband signal received from the transceiving circuits 230_1 and 230_2 and provide the baseband signal generated by modulating the data signal to the transceiving circuits 230_1 and 230_2. In addition, the modem 250 may generate the digital reference signal used for the frequency down conversion or the frequency up conversion of the transceiving circuits 230_1 and 230_2 and provide the generated digital reference signal to the transceiving circuits 230_1 and 230_2. The modem 250 may control a division operation for the frequency signal of the shared phase locked loop circuit such that each of the receiving circuits 234_1 and 234_2 or the transmitting circuits 236_1 and 236_2 acquires the frequency signal having the target frequency. The modem 250 may include a memory 250a, and the memory 250a may store instructions that are defined to perform the described-above operations of the modem 250. The modem 250 may perform operations thereof according to the example embodiments by executing the instructions stored in the memory 250a.

Figure 5:
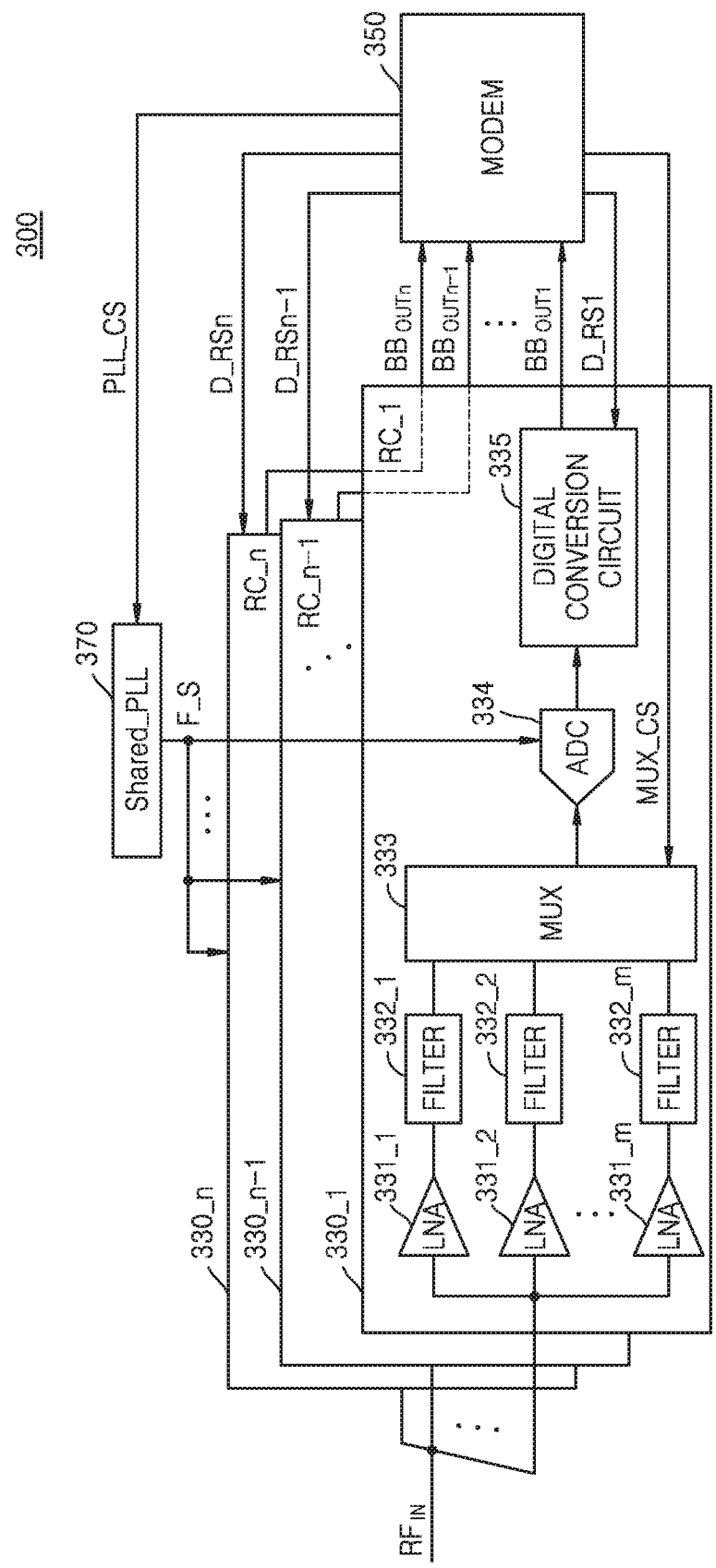
FIG. 5 is a block diagram illustrating a connection relationship between a plurality of receiving circuits of a wireless communication device, according to an example embodiment.

FIG. 5 is a block diagram illustrating a connection relationship between a plurality of receiving circuits of a wireless communication device 300, according to an example embodiment.

Referring to FIG. 5, the wireless communication device 300 may include first through $n^{th}$ receiving circuits 330_1 through 330_n, a modem 350, and a share phase locked loop circuit (Shared_PLL) 370. The first receiving circuit 330_1 may include first through $m^{th}$ low noise amplifiers (LNAs) 331_1 through 331_m, first through $m^{th}$ filters 332_1 through 332_m, a multiplexer (MUX) 333, an ADC 334, and a digital conversion circuit 335, and a configuration of the first receiving circuit 330_1 may be applied to the second through $n^{th}$ receiving circuits 330_2 through 330_n. An RF signal $RF_{IN}$ may be transmitted via carriers in at least one band group, and at least one of the first through $n^{th}$ receiving circuits 330_1 through 330_n may be selected according to a CA type (that is, the intra-CA or the inter-CA) to receive the RF signal $RF_{IN}$.

In some example embodiments, the Shared-PLL 370 may include a voltage-controlled oscillator and a frequency multiplier and may generate a frequency signal having a certain frequency. The frequency of the frequency signal generated by the Shared-PLL 370 may be controlled by the modem 350 by a PLL control signal PLL_CS. The Shared-PLL 370 may be implemented as a local oscillator according to an example embodiment and may have a structure in which the first through $n^{th}$ receiving circuits 330_1 through 330_n share one local oscillator.

The first LNA 331_1 and the first filter 332_1 may constitute a path through which a signal component transmitted by the carrier corresponding to one band group among the signal components of the RF signal is received. In addition, for supporting the inter-CA described with reference to FIG. 2C, the first LNA 331_1 and the first filter 332_1 may constitute a path through which the signal component transmitted by a carrier corresponding to one frequency band among the signal components of the RF signal is received. In other words, it may be possible to construct paths capable of receiving the RF signal $RF_{IN}$ corresponding to each band group (or each frequency band) via the first through $m^{th}$ LNAs 331_1 through 331_m and the first through $m^{th}$ filters 332_1 through 332_m, and the MUX 333 may receive a multiplexer control signal MUX_CS from the modem 350 and perform the CA operation by selecting one of the plurality of paths based on the received multiplexer control signal MUX_CS. In other words, the first receiving circuit 330_1 may receive the RF signal $RF_{IN}$ corresponding to one band group among the plurality of band groups through the configuration of the first through $m^{th}$ LNAs 331_1 through 331_m, the first through $m^{th}$ filters 332_1 through 332_m, and the MUX 333. The first through $m^{th}$ filters 332_1 through 332_m may be implemented to pass only components of the RF signal $RF_{IN}$ corresponding to a particular band group. However, the example embodiment is not limited thereto, and the first through $m^{th}$ filters 332_1 through 332_m may selectively filter the RF signals $RF_{IN}$ to support the CA. For example, a filter may have various passbands.

The ADC 334 may receive a frequency signal F_S having a certain frequency from the Shared_PLL 370. The Shared_PLL 370 may provide the same frequency signal F_S to the first through $n^{th}$ receiving circuits 330_1 through 330_n. In other words, the first through $n^{th}$ receiving circuits 330_1 through 330_n may be implemented to share one Shared_PLL 370. The ADC 334 may receive the RF signal $RF_{IN}$ that has passed through a selected path from the MUX 333 and may perform the analog to digital conversion based on the frequency signal F_S.

The digital conversion circuit 335 may perform the frequency down conversion on the RF signal F_S that has been converted into the digital signal based on a first digital reference signal D_RS1 received from the modem 350. In other words, the digital conversion circuit 335 may perform an operation of converting an RF band signal into the baseband signal. The first digital reference signal D_RS1 may vary according to the frequency channel corresponding to the RF signal $RF_{IN}$. For example, referring further to FIG. 2A, the first digital reference signal D_RS1 in the case when the RF signal $RF_{IN}$ corresponds to a frequency channel in the high-band may be different from that in the case when the RF signal RF_IN corresponds to a frequency channel in the low-band.

The digital conversion circuit 335 may provide to the modem 350 a first digital baseband signal $BB_{OUT1}$ generated as a result of performing the frequency down conversion, and the modem 350 may process (or demodulate) the first digital baseband signal $BB_{OUT1}$ and generate the data signal. The above-described configuration of the first receiving circuit 330_1 may be applied to the second through $n^{th}$ receiving circuits 330_2 through 330_n. In other words, the modem 350 may provide second through $n^{th}$ digital reference signals D_RS2 through D_RSn to the second through $n^{th}$ receiving circuits 330_2 through 330_n, respectively, and may receive second through $n^{th}$ digital baseband signals $BB_{OUT2}$ through $BB_{OUTn}$ from the second through $n^{th}$ receiving circuits 330_2 through 330_n, respectively.

The first through $n^{th}$ receiving circuits 330_1 through 330_n according to an example embodiment may include the digital conversion circuit 335 that receives the digital reference signal from the modem 350 and performs the frequency down conversion, so that the local oscillator which generates the frequency signal variable according to the frequency channel corresponding to the RF signal RFIN is not needed. In addition, since a structure in which the first through $n^{th}$ receiving circuits 330_1 through 330_n share the Shared_PLL 370 is applicable, a size of the RF integrated circuit including the first through $n^{th}$ receiving circuits 330_1 through 330_n may be reduced, and the power consumption of the RF integrated circuit may also be reduced.

Figure 6A:
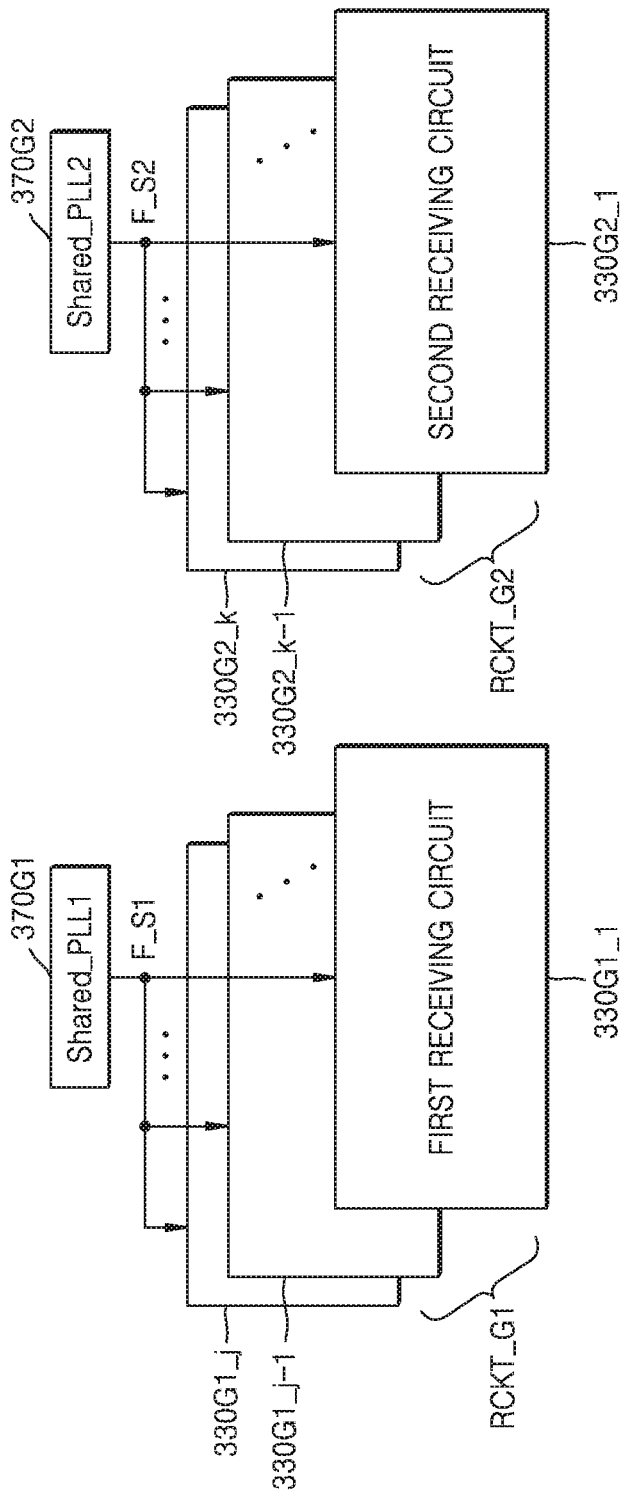
FIGS. 6A through 6C are diagrams illustrating a connection structure between receiving circuits and shared phase locked loop circuits, according to example embodiments.
Figure 6B:
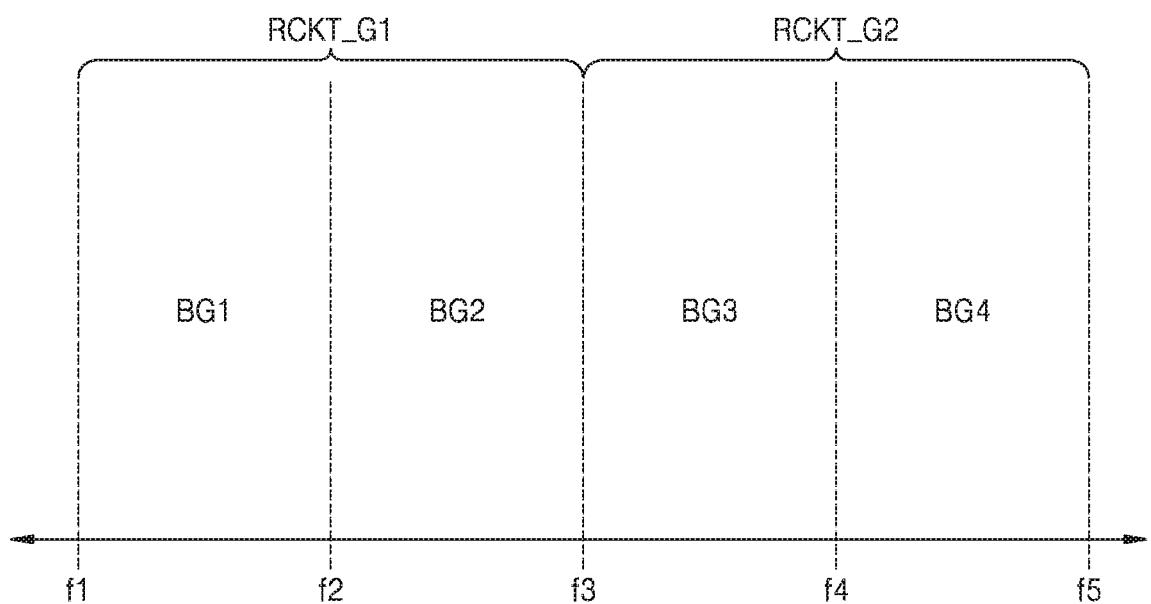
Figure 6C:
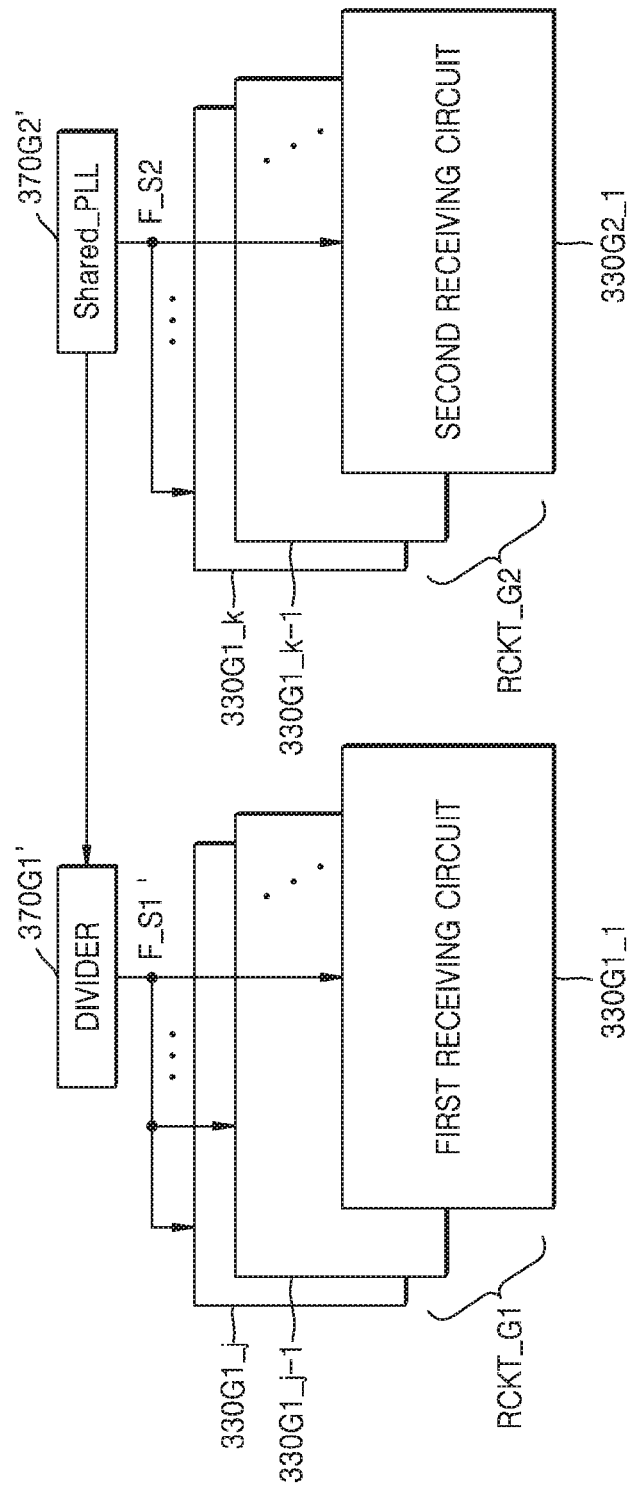

FIGS. 6A through 6C are diagrams illustrating a connection structure between receiving circuits and shared phase locked loop circuits, according to example embodiments.

Referring to FIG. 6A, the RF integrated circuit may include a plurality of first receiving circuits (330G1_1 through 330G1_j), a plurality of second receiving circuits (330G2_1 through 330G2_k), a first Shared_PLL (Shared_PLL1) 370G1, and a second Shared_PLL (Shared_PLL2) 370G2. The plurality of first receiving circuits (330G1_1 through 330G1_j) may be grouped into a first receiving circuit group RCKT_G1, and the plurality of second receiving circuits (330G2_1 through 330G2_k) may be grouped into a second receiving circuit group RCKT_G2. The first and second receiving circuit groups RCKT_G1 and RCKT_G2 may be defined as units for grouping receiving circuits sharing one of Shared_PLL1 370G1 and Shared_PLL2 370G2, respectively.

In some example embodiments, the first receiving circuit group RCKT_G1 may be connected to the Shared_PLL1 370G1 to receive a first frequency signal F_S1 of a first frequency. The second receiving circuit group RCKT_G2 may be connected to the Shared_PLL2 370G2 to receive a second frequency signal F_S2 of a second frequency. The first frequency of the first frequency signal F_S1 and the second frequency of the second frequency signal F_S2 may be the same as or different from each other. Although FIG. 6A illustrates an example embodiment in which two receiving circuit groups (RCKT_G1 and RCKT_G2) are distinguished, the example embodiment is not limited thereto. More implementation examples may be feasible such that the receiving circuits are grouped into more receiving circuit groups than those illustrated in FIG. 6A, and each receiving circuit group may be individually connected to a shared phase locked loop circuit. That is, the number of receiving circuit groups is not particularly limited and may be more than the two illustrated in FIG. 6A.

Hereinafter, an example embodiment of a criterion in which the receiving circuits are grouped into a receiving circuit group is described with reference to FIG. 6B. Referring to FIGS. 6A-6B, the plurality of first receiving circuits (330G1_1 through 330G1_j) may have a configuration capable of receiving the first frequency signal F_S1 corresponding to a first band group BG1 between a first frequency f1 and a second frequency f2 and a second band group BG1 between the second frequency f2 and a third frequency f3, and the plurality of second receiving circuits (330G2_1 through 330G2_k) may have a configuration capable of receiving the second frequency signal F_S2 corresponding to a third band group BG3 between the third frequency f3 and a fourth frequency f4 and a fourth band group BG4 between the fourth frequency f4 and a fifth frequency f5. For example, the plurality of first receiving circuits (330G1_1 through 330G1_j) may include filters for receiving the first frequency signal F_S1 corresponding to the first and second band groups BG1 and BG2, and the plurality of second receiving circuits (330G2_1 through 330G2_k) may include filters for receiving the second frequency signal F_S2 corresponding to the third and fourth band groups BG3 and BG4. In other words, the first and second band groups BG1 and BG2 corresponding to the first frequency signal F_S1 receivable by the plurality of first receiving circuits (330G1_1 through 330G1_j) and the third and fourth band groups BG3 and BG4 corresponding to the second frequency signal F_S2 receivable by the plurality of second receiving circuits (330G2_1 through 330G2_k) may be different from each other. At this time, the plurality of first receiving circuits (330G1_1 through 330G1_j) may be grouped into the first receiving circuit group RCKT_G1, and the plurality of second receiving circuits (330G2_1 through 330G2_k) may be grouped into the second receiving circuit group RCKT_G2. The first frequency signal F_S1 received by the plurality of first receiving circuits (330G1_1 through 330G1_j) from the Shared_PLL1 370G1 may have a lower frequency that the second frequency signal F_S2 received by the plurality of second receiving circuits (330G2_1 through 330G2_k) from the Shared_PLL2 370G2.

The first through fourth band groups BG1 through BG4 described with reference to FIG. 6B are only example embodiments. There may be fewer or more band groups, and the receiving circuits may be grouped according to the band groups of the frequency signals receivable thereby. In addition, the RF integrated circuit may include a greater number of shared phase locked loop circuits than that illustrated in FIG. 6A according to an example embodiment.

Referring to FIG. 6C, the RF integrated circuit may include the plurality of first receiving circuits (330G1_1 through 330G1_j), the plurality of second receiving circuits (330G2_1 through 330G2_j), a frequency divider 370G1', and a Shared_PLL 370G2'. In some example embodiments, the second receiving circuit group RCKT_G2 may be connected to the Shared_PLL 370G2' to receive the second frequency signal F_S2 of a certain frequency. The first receiving circuit group RCKT_G1 may be connected to the frequency divider 370G1' to receive a signal F_S1' that is a signal divided from the second frequency signal F_S2. A division ratio of the frequency divider 370G1' may be determined according to a band group (or a frequency band in a band group, or a frequency channel) of the RF signal receivable by the plurality of first receiving circuits (330G1_1 through 330G1_j). The example embodiment illustrated in FIG. 6C is only illustrative, and various implementations may be possible in which more frequency dividers are respectively connected to more receiving circuit groups.

Figure 7:
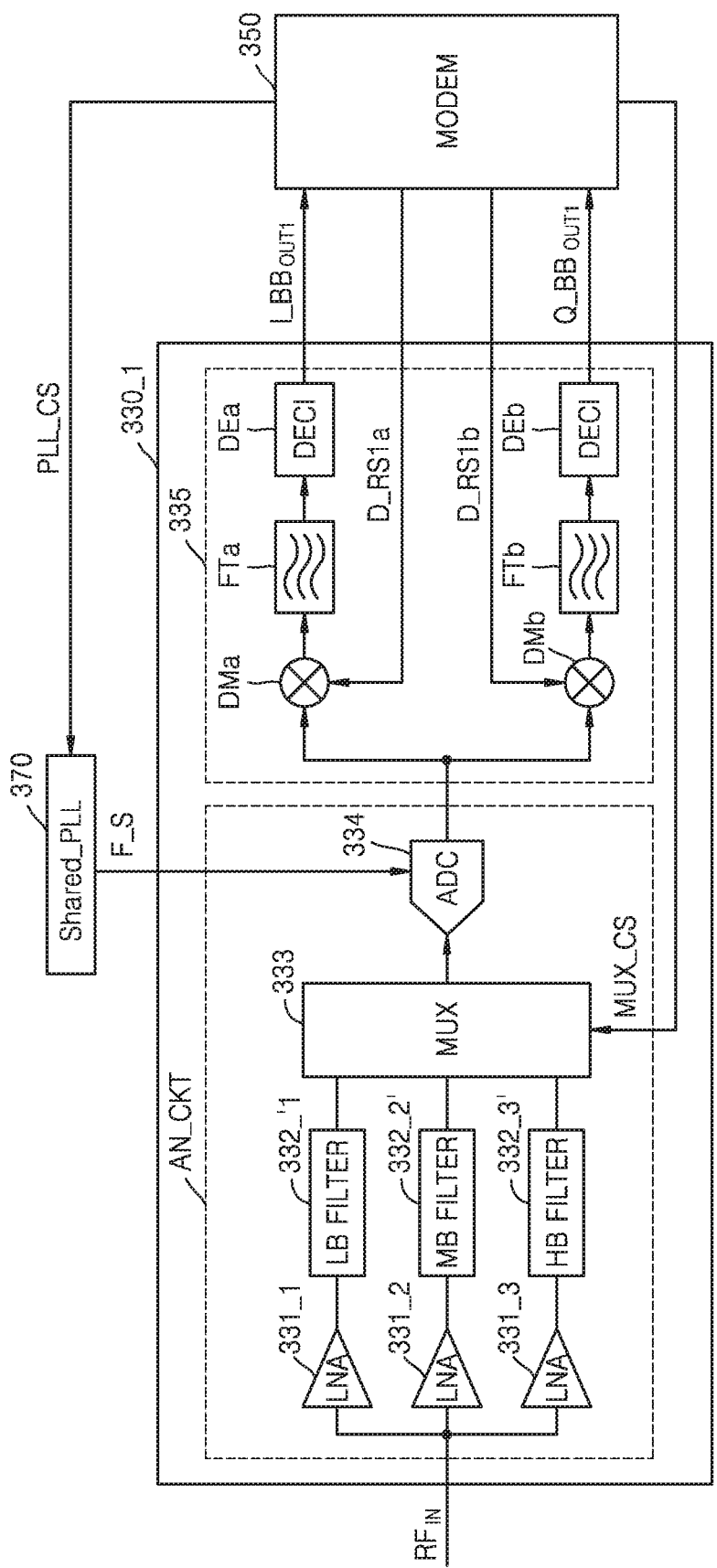
FIG. 7 is a block diagram of a first receiving circuit in FIG. 5 according to an example embodiment.

FIG. 7 is a block diagram of the first receiving circuit 330_1 in FIG. 5 according to an example embodiment.

Referring to FIG. 7, the first receiving circuit 330_1 may include the first through third LNAs 331_1 through 331_3, a low band (LB) filter 332_1', a medium band (MB) filter 332_2', a high band (HB) filter 332_3', the MUX 333, the ADC 334, and the digital conversion circuit 335. The first through third LNAs 331_1 through 331_3, the LB filter 332_1', the MB filter 332_2', the HB filter 332_3', the MUX 333, and the ADC 334 may be referred to as an analog circuit AN_CKT to which the original RF signal RF$_{IN}$ is input. The digital conversion circuit 335 may include digital mixers DMa and DMb, digital low-pass filters FTa and FTb, and digital decimation filters DEa and DEb.

The LB filter 332_1' may pass only the signal component corresponding to the LB of the RF signal RF$_{IN}$, the MB filter 332_2' may pass only the signal component corresponding to the MB of the RF signal RF$_{IN}$, and the HB filter 332_3' may pass only the signal component corresponding to the HB of the RF signal RF$_{IN}$. However, the example embodiment is only an example, and each of the LB, MB, and HB filters 332_1', 332_2', and 332_3' may be implemented to pass only the signal component corresponding to a different frequency band, and the first receiving circuit 330_1 may include more than three of the filters 332. Hereinafter, for convenience of description, it is assumed that each of the LB, MB, and HB filters 332_1', 332_2', and 332_3' is implemented to pass only the signal component corresponding to a different band group. The modem 350 may provide the MUX control signal MUX_CS to the MUX 333 and control the MUX 333 so that the RF signal RF$_{IN}$ that has passed through any one of the LB, MB, and HB filters 332_1', 332_2', and 332_3' is output to the ADC 334. The ADC 334 may receive the frequency signal F_S from the Shared_PLL 370 and perform sampling on the analog RF signal RF_IN based on the frequency signal F_S to generate the digital RF signal RF$_{IN}$.

The digital mixers DMa and DMb may receive digital reference signals D_RS1$a$ and D_RS1$b$ from the modem 350, respectively, and may divide the digital RF signals into an I channel and a Q channel by using the digital reference signals D_RS1$a$ and D_RS1$b$, respectively, and generate frequency down converted digital signals. The generated frequency down converted digital signals may be filtered by passing through respective digital low-pass filters FTa and FTb to remove signals generated during the frequency down conversion. The filtered digital signals may be down-sampled by passing through respective decimation filters DEa and DEb, respectively, and as a result, an I digital baseband signal I_BB$_{OUT1}$ and a Q digital baseband signal Q_BB$_{OUT2}$ including samples of the signal corresponding to the target frequency channel may be generated, respectively. The modem 350 may receive the I digital baseband signal I_BB$_{OUT1}$ and the Q digital baseband signal Q_BB$_{OUT2}$ from the digital conversion circuit 335. The modem 350 may control the degree of down-sampling of the digital decimation filters DEa and DEb, and thus, may optimize a processing operation speed for the I and Q digital baseband signals I_BBOUT1 and Q_BBOUT2 thereof.

The modem 350 may change the digital reference signals D_RS1$a$ and D_RS1$b$ according to the frequency channel corresponding to the RF signal RF_IN received by the first receiving circuit 330_1. For example, when a path constituted by the first LNA 331_1 and the LB filter 332_1' is activated by the MUX 333, the first receiving circuit 330_1 may receive the RF signal RF$_{IN}$ corresponding to the LB, and the modem 350 may generate the digital reference signals D_RS1$a$ and D_RS1$b$ having certain values so that the digital conversion circuit 335 performs the frequency down-conversion on the RF signal RF_IN from the frequency channel in the LB to the baseband. In addition, when a path constituted by the second LNA 331_2 and the MB filter 332_2' is activated by the MUX 333, the first receiving circuit 330_1 may receive the RF signal RF$_{IN}$ corresponding to the MB, and the modem 350 may generate the digital reference signals D_RS1$a$ and D_RS1$b$ having certain values so that the digital conversion circuit 335 performs the frequency down-conversion on the RF signal RF$_{IN}$ from the frequency channel in the MB to the baseband.

The configuration of the first receiving circuit 330_1 illustrated in FIG. 7 may be applied to the other second through n$^{th}$ receiving circuits 330_2 through 330_n illustrated in FIG. 5.

Figure 8A:
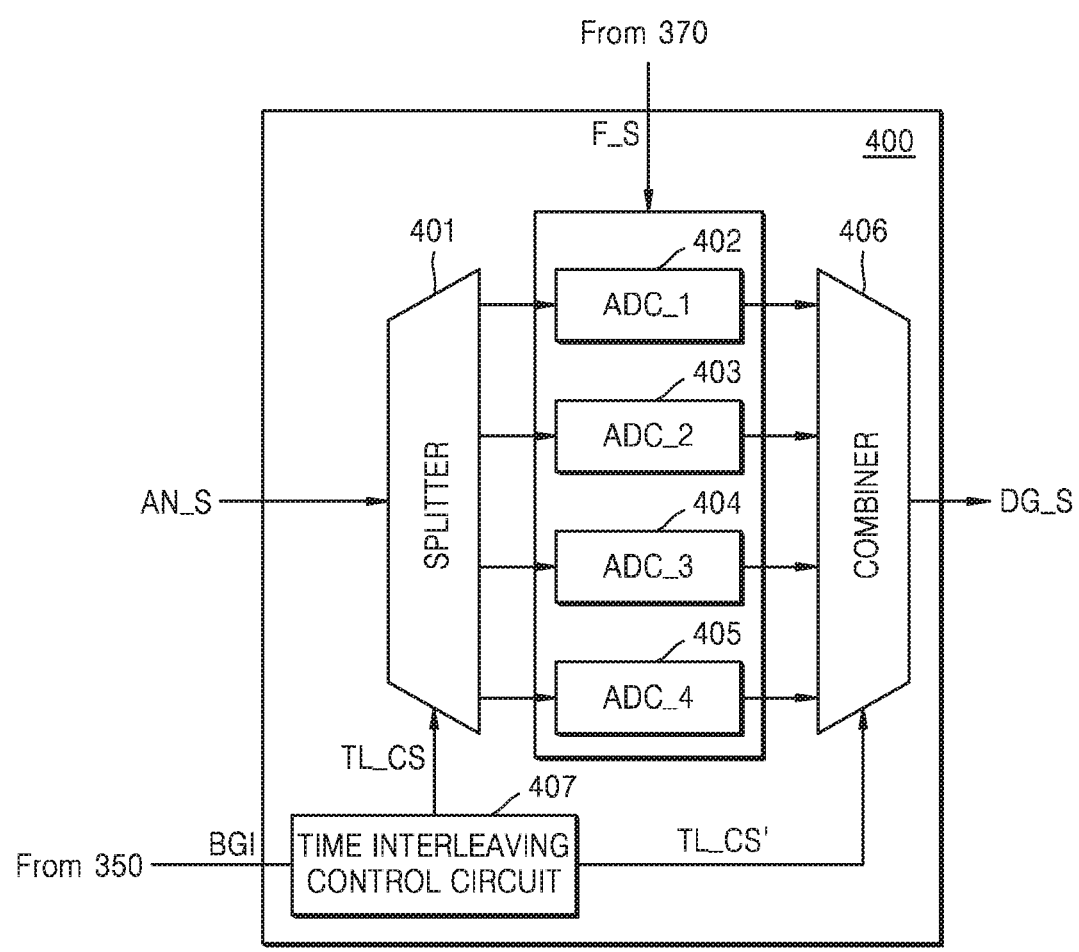
FIGS. 8A and 8B are diagrams illustrating implementation examples of a time interleaved analog to digital converter (ADC) capable of time interleaving, according to example embodiments.
Figure 8B:
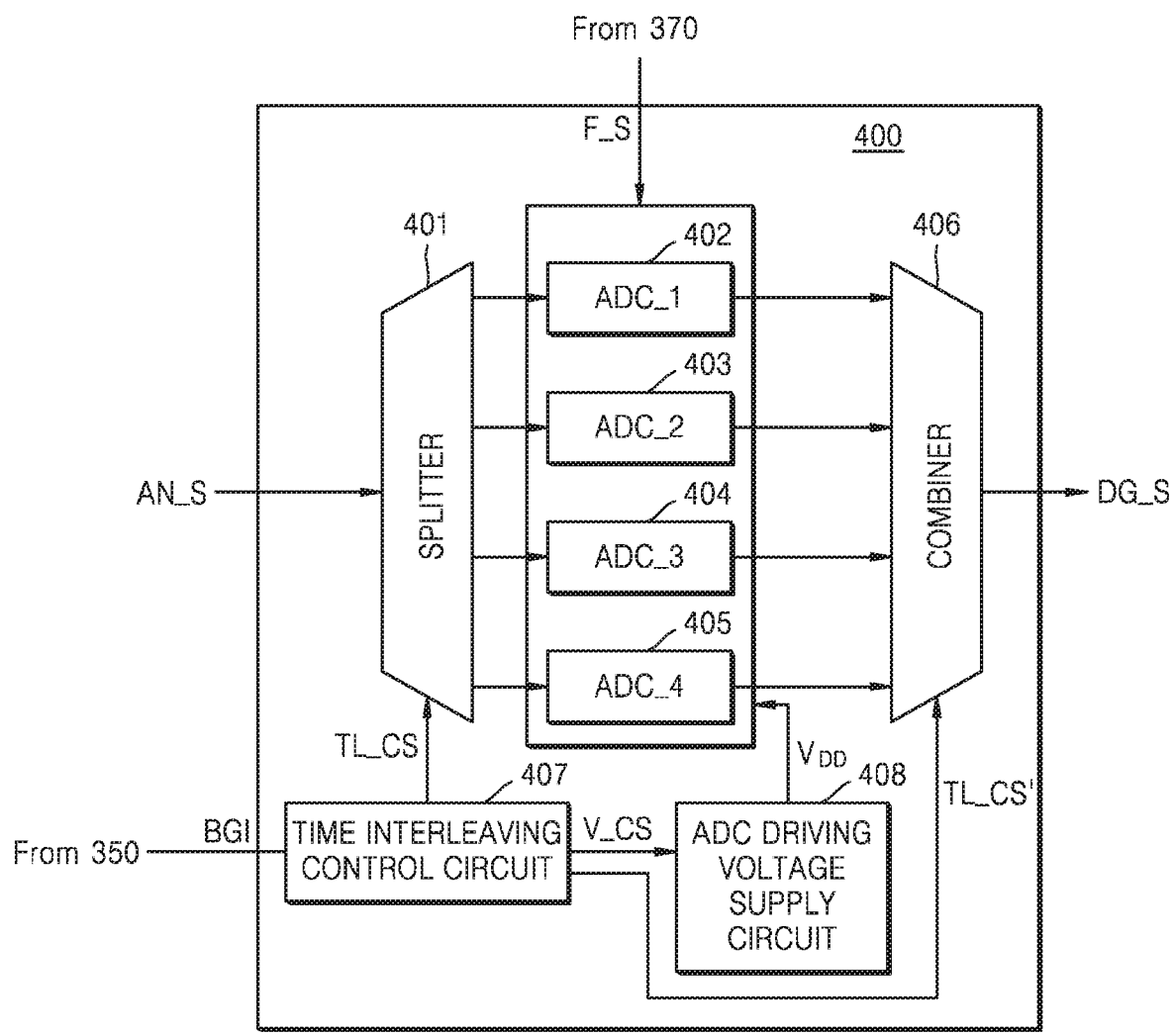

FIGS. 8A and 8B are diagrams illustrating implementation examples of a time interleaved ADC 400 capable of time interleaving, according to example embodiments.

According to an example embodiment, the ADC 334 in FIG. 7 may be implemented as the time interleaved ADC 400 of FIG. 8A. The time interleaved ADC 400 may include a splitter 401, a first ADC circuit ADC_1 402, a second ADC circuit ADC_2 403, a third ADC circuit ADC_3 404, and a fourth ADC circuit ADC_4 405, a combiner 406, and a time interleaving control circuit 407. The time interleaving control circuit 407 may receive band group information (BGI) corresponding to the RF signal RFIN received by the first receiving circuit 330_1 from the modem 350 (refer to FIG. 7) and may control a sampling rate of the time interleaved ADC 400 by providing time interleaving control signals TL_CS and TL_CS' to the splitter 401 and the combiner 406, respectively, based on the BGI.

The splitter 401 may receive an analog signal (or an RF signal) AN_S and provide the analog signal AN_S to the first through fourth ADC circuits 402 through 405 with a constant time difference based on the time interleaving control signal TL_CS. As a result, the first through fourth ADC circuits 402 through 405 may receive the analog signal AN_S and the frequency signal F_S from the Shared_PLL 370 (refer to FIG. 7), which have different constant phases from each other, and may digitally convert the received analog signal AN_S based on the same sampling rate and provide results of the digital conversion to the combiner 406. The combiner 406 may combine the results of the digital conversion from the first through fourth ADC circuits 402 through 405 based on the time interleaving control signal TL_CS' and may generate a digital signal DG_S.

Since the first receiving circuit (330_1 in FIG. 7) shares the phase locked loop circuit (370 in FIG. 7) with other receiving circuits, it may be difficult for the first receiving circuit 330_1 to obtain a frequency signal having an appropriate frequency for an appropriate sampling rate every time in an actual ADC operation. Accordingly, the first receiving circuit (330_1 in FIG. 7) may be implemented to include the time interleaved ADC 400 of FIG. 8A, thereby selectively controlling the first through fourth ADC circuits 402 through 405 to appropriately change the sampling rate of the whole time interleaved ADC 400. For example, when the time interleaved ADC 400 receives the frequency signal F_S having a frequency lower than a threshold frequency, the time interleaving control circuit 407 may selectively use a larger number of ADC circuits than a number of ADC circuits that would be used at the threshold frequency to obtain an appropriate sampling rate. When the frequency signal F_S having a frequency higher than the threshold frequency is received, the time interleaving control circuit 407 may selectively control a smaller number of ADC circuits than a number of ADC circuits that would be used at the threshold frequency to obtain the appropriate sampling rate.

However, the example embodiment is only an example. The time interleaving control circuit 407 may receive frequency band-related information or frequency channel-related information corresponding to the RF signal RFIN received by the first receiving circuit 330_1 from the modem (350 in FIG. 7) and may control the sampling rate of the time interleaved ADC 400 based on the frequency band related information or the frequency channel-related information. When the time interleaved ADC 400 is controlled based on the frequency band related information or the frequency channel-related information, it may be possible to adjust the sampling rate more finely than the case when the time interleaved ADC 400 is controlled based on the BGI.

FIG. 8A illustrates an example embodiment in which the time interleaved ADC 400 includes the separate time interleaving control circuit 407, but the example embodiment is not limited thereto, and in some example embodiments, the modem (350 in FIG. 7) may be implemented to control directly the time interleaved ADC 400. In addition, FIG. 8A illustrates an example embodiment in which the time interleaved ADC 400 includes four ADC circuits (that is, 402 through 405), but the example embodiment is not limited thereto, and the time interleaved ADC 400 may be implemented as including less or more ADC circuits than the number illustrated in FIG. 8A.

Referring to FIG. 8B, the time interleaving ADC 400 may further include an ADC driving voltage supply circuit 408 in comparison with FIG. 8A. The time interleaving control circuit 407 may provide the ADC driving voltage supply circuit 408 with a voltage supply control signal V_CS including information about at least one ADC circuit used in an ADC operation. The ADC driving voltage supply circuit 408 may provide a driving voltage $V_{DD}$ to at least one of the first through fourth ADC circuits 402 through 405 used for an ADC operation based on the voltage supply control signal V_CS, but may not provide the driving voltage $V_{DD}$ to the ADC circuit that is not used for the ADC operation. In other words, the ADC driving voltage supply circuit 408 may provide the driving voltage $V_{DD}$ only to the ADC circuit that is used for the ADC operation, thereby reducing power consumption.

Figure 9A:
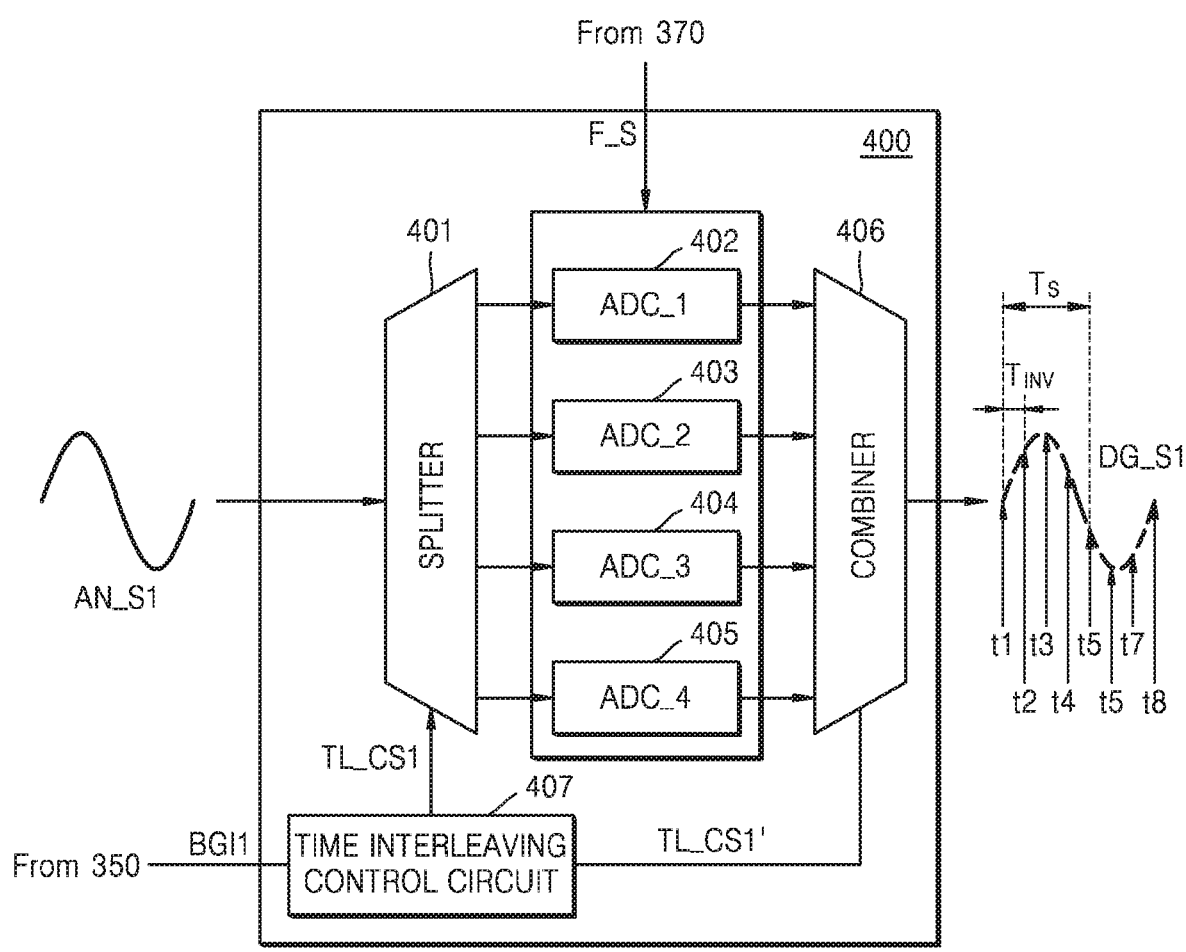
FIGS. 9A and 9B are diagrams for explaining detailed operations of the time interleaving ADC of FIGS. 8A and 8B, according to example embodiments.
Figure 9B:
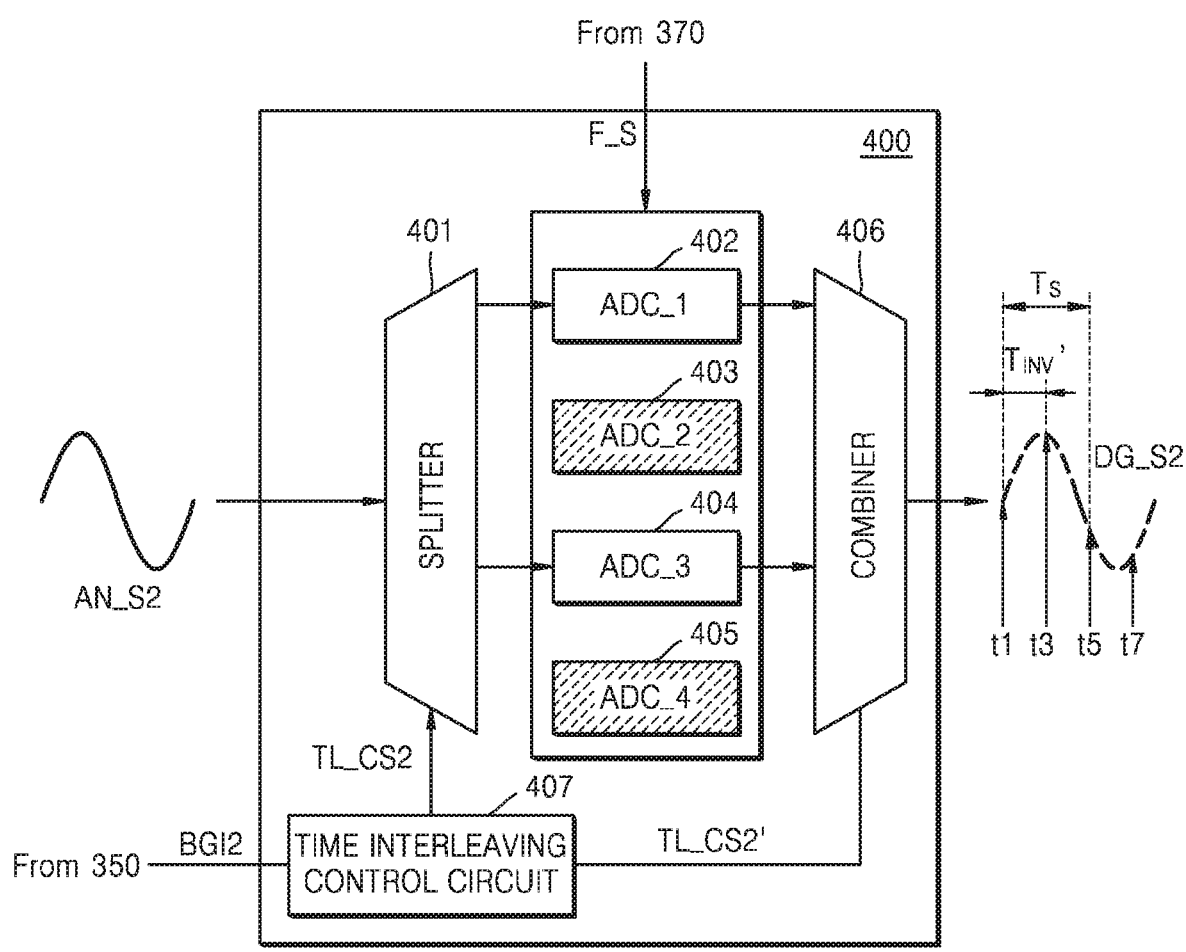

FIGS. 9A and 9B are diagrams for explaining detailed operations of the time interleaved ADC 400, according to example embodiments.

Referring to FIG. 9A, the time interleaving control circuit 407 may determine the sampling rate of the time interleaved ADC 400 based on a first BGI BGI1 received from the modem (350 in FIG. 7) and may provide first time interleaving control signals TL_CS1 and TL_CS1' to the splitter 401 and the combiner 406. The splitter 401 may receive an analog signal AN_S1 and provide an analog signal AN_S1 with a certain time interval $T_{INV}$ to the first through fourth ADC circuits 402 through 405 based on the first time interleaving control signal TL_CS1. The first through fourth ADC circuits 402 through 405 may perform a sampling operation every certain time period Ts based on the frequency signal F_S received from the shared phase locked loop circuit (370 in FIG. 7). Sampling results respectively generated by sampling the analog signal AN_S1 at each of first through eighth times t1 through t8 via the first through fourth ADC circuits 402 through 405 may be provided to the combiner 406, and the combiner 406 may output a digital signal DG_S1 by combining the sampling results based on the first interleaving control signal TL_CS1'.

Referring to FIG. 9B, the time interleaving control circuit 407 may determine the sampling rate of the time interleaved ADC 400 based on a second BGI BGI2 received from the modem (350 in FIG. 7), and may provide second time interleaving control signals TL_CS2 and TL_CS2' to the splitter 401 and the combiner 406. The splitter 401 may receive an analog signal AN_S2 and provide an analog signal AN_S2 with a certain time interval TINV' to the first and third ADC circuits 402 and 404 based on the second time interleaving control signal TL_CS2. The first and third ADC circuits 402 and 404 may perform a sampling operation on the analog signal AN_S2 every certain time period Ts based on the frequency signal F_S received from the shared phase locked loop circuit (370 in FIG. 7). Sampling results respectively generated by sampling the analog signal AN_S2 at the first, third, fifth, and eighth times t1, t3, t5, and t8 via the first and third ADC circuits 402 and 404 may be provided to the combiner 406, and the combiner 406 may output a digital signal DG_S2 by combining the sampling results based on the second time interleaving control signal TL_CS2'. Further, as described above with reference to FIG. 8B, in some example embodiments the ADC driving voltage supply circuit (408 in FIG. 8B) may be provided and controlled such that the driving voltage $V_{DD}$ is not provided to the second and fourth ADC circuits 403 and 405. For example, the driving voltage $V_{DD}$ may only be provided to the first and third ADC circuits 402 and 404, and may not be provided to the second and fourth ADC circuits 403 and 405, which are indicated by shading, in FIG. 9B.

By controlling the time interleaved ADC 400 in the manner as described with reference to FIGS. 9A and 9B, the sampling rate may be appropriately adjusted without directly changing the frequency of the frequency signal F_S.

Figure 10A:
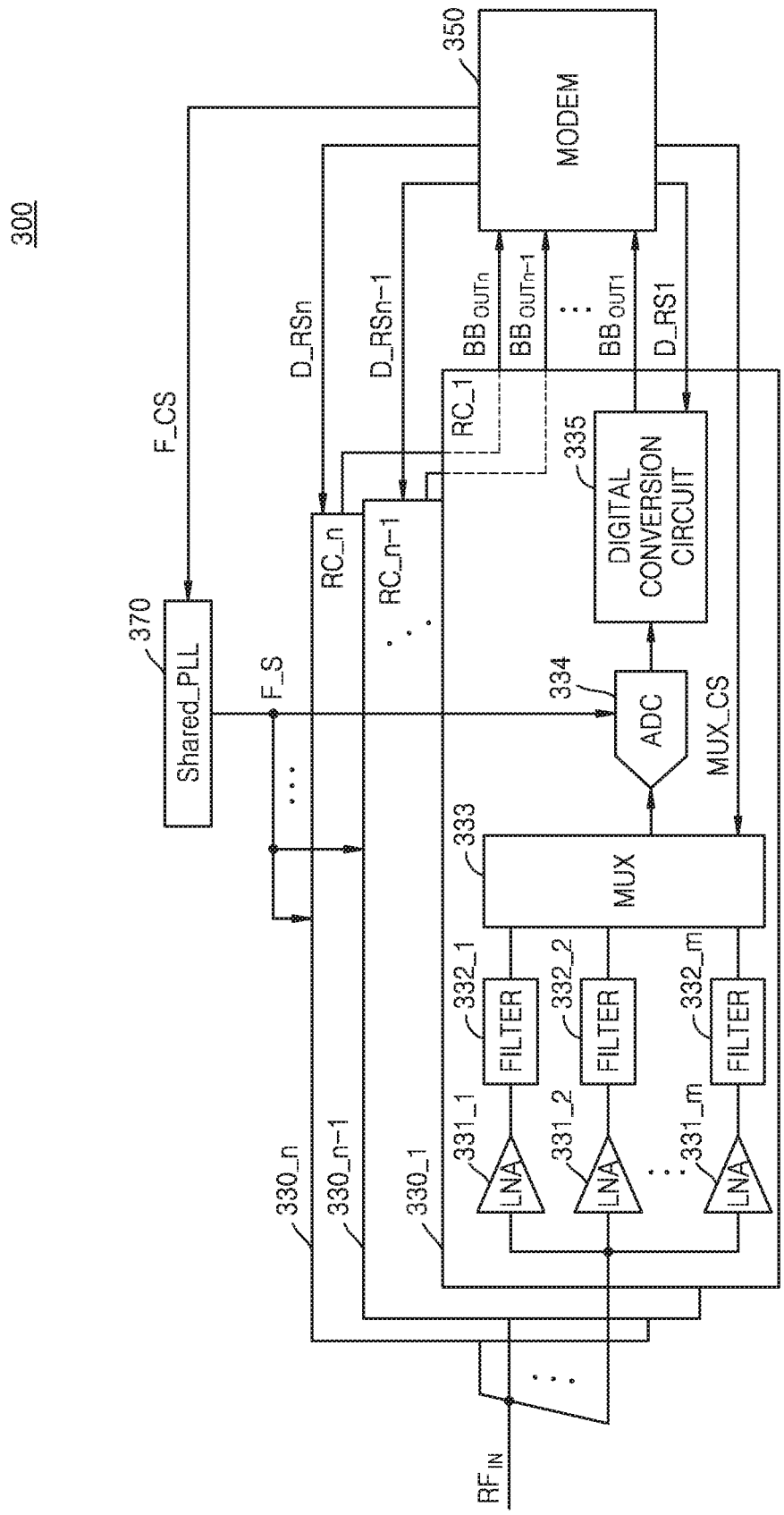
FIGS. 10A and 10B are block diagrams of implementation examples of a wireless communication device including a frequency divider, according to an example embodiment.
Figure 10B:
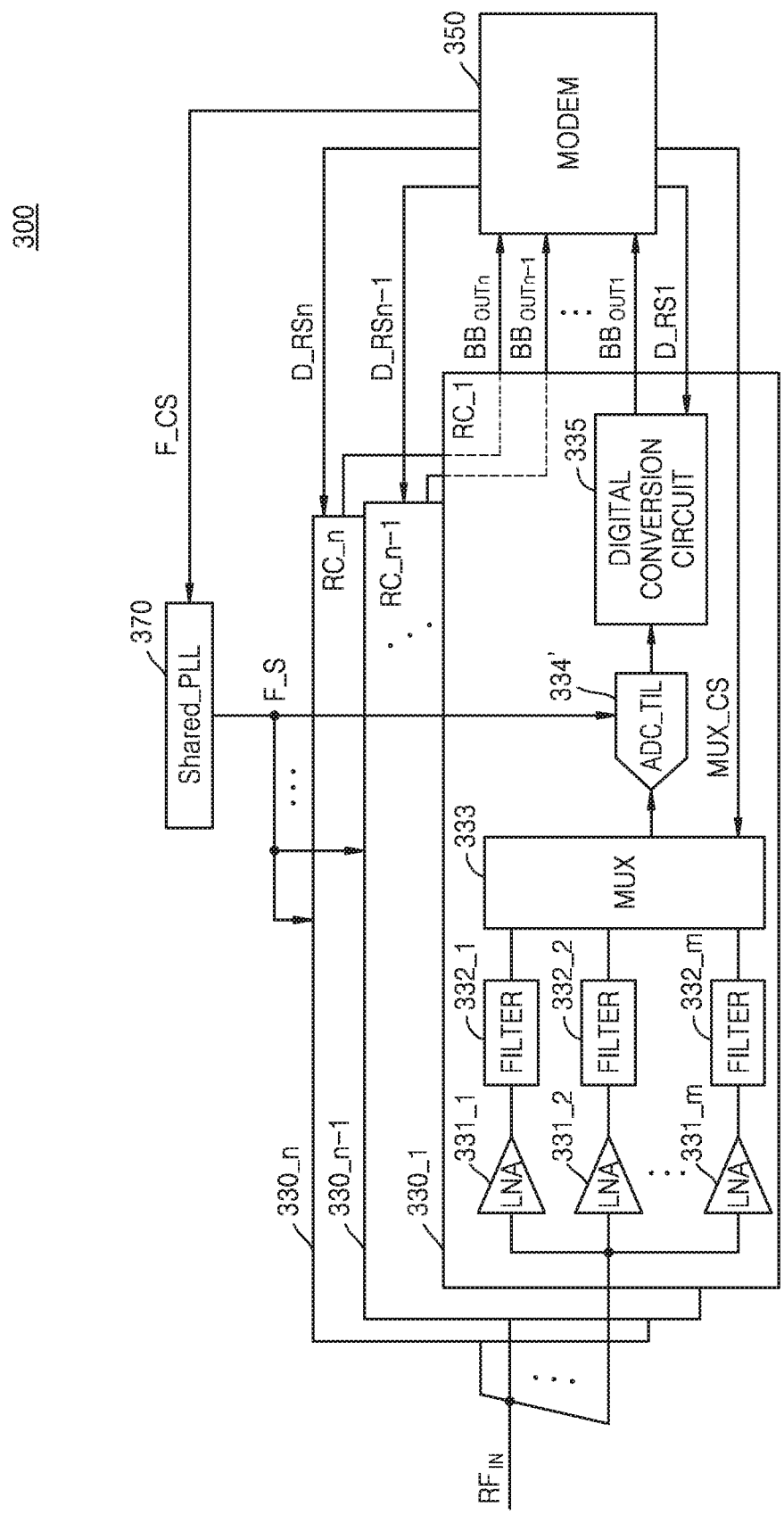

FIGS. 10A and 10B are block diagrams of implementation examples of the wireless communication device 300 including the Shared_PLL 370 for generating a frequency signal having a variable frequency, according to example embodiments.

The wireless communication device 300 of FIG. 10A may receive a frequency control signal F_CS from the modem 350, in comparison with the wireless communication device 300 of FIG. 5. Hereinafter, contents overlapping with those given with reference to FIG. 5 are omitted, and only new configurations are described.

Referring to FIG. 10A, the modem 350 may generate the frequency control signal F_CS based on the BGI of the RF signal $RF_{IN}$ received by the first through $n^{th}$ receiving circuits 330_1 through 330_n. For example, when the first receiving circuit 330_1 receives the RF signal $RF_{IN}$ corresponding to the LB, the second receiving circuit 330_2 receives the RF signal $RF_{IN}$ corresponding to the MB, and the third receiving circuit 330_3 receives the RF signal $RF_{IN}$ corresponding to the HB, the modem 350 may generate the frequency control signal F_CS by determining the target frequency based on the band group of the HB corresponding to the highest band group. As another example, when the first receiving circuit 330_1 receives the RF signal $RF_{IN}$ corresponding to the LB and the second receiving circuit 330_2 receives the RF signal $RF_{IN}$ corresponding to the MB, the modem 350 may generate the frequency control signal F_CS by determining the target frequency based on the band group of the MB corresponding to the highest band group.

The Shared_PLL 370 may receive the frequency control signal F_CS from the modem 350 and may provide the first through $n^{th}$ receiving circuits 330_1 through 330_n with the frequency signal F_S having the target frequency based on the frequency control signal F_CS. In other words, the Shared_PLL 370 may provide the first through $n^{th}$ receiving circuits 330_1 through 330_n with the frequency signal F_S having a relatively high frequency such that an appropriate ADC operation is performed by using the receiving circuit having the highest band group corresponding to the received RF signal $RF_{IN}$ among the first through $n^{th}$ receiving circuits 330_1 through 330_n.

In other example embodiments, the modem 350 may generate the frequency control signal F_CS based on information about the frequency band or the frequency channel of the RF signal $RF_{IN}$ received by the first through $n^{th}$ receiving circuits 330_1 through 330_n, thereby adjusting the frequency control signal F_CS more finely.

Referring to FIG. 10B, each of the first through $n^{th}$ receiving circuits 330_1 through 330_n may include an ADC that is implemented by the time interleaved ADC described with reference to FIG. 8A and the like. Hereinafter, the first receiving circuit 330_1 is described as an example. The first receiving circuit 330_1 may include a time interleaved ADC (ADC_TIL) 334'. As described with reference to FIG. 10A, since the frequency of the frequency signal F_CS is determined by using the receiving circuit having the highest band group corresponding to the received RF signal $RF_{IN}$, the frequency of the frequency signal F_S may not have an appropriate frequency for performing the ADC operation. At this time, the modem 350 may provide the ADC_TIL 334' with information on the BGI of the RF signal $RF_{IN}$ received by the first receiving circuit 330_1, and the ADC_TIL 334' may adjust the sampling rate based on the BGI. In another embodiment, the modem 350 may provide the ADC_TIL 334' with the frequency band-related information or the frequency channel-related information of the RF signal $RF_{IN}$ received by the first receiving circuit 330_1, and the ADC_TIL 334' may adjust the sampling rate based on the frequency band-related information or the frequency channel-related information. Detailed description has been given with reference to FIG. 8A and thus, repeated description thereof is omitted.

Figure 11A:
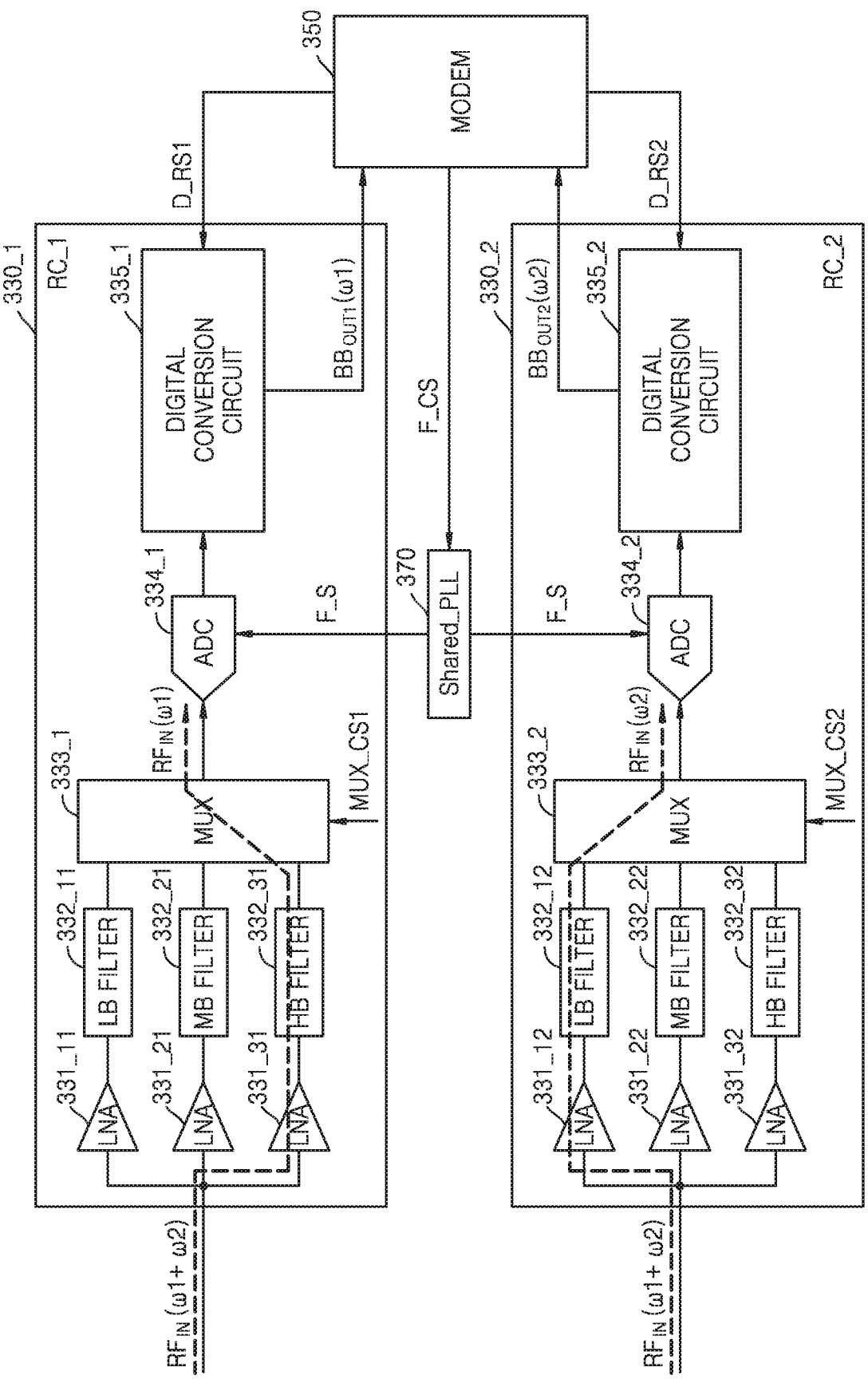
FIGS. 11A and 11B are diagrams for explaining operations of receiving circuits and a modem when an inter-CA operation is performed, according to example embodiments.
Figure 11B:
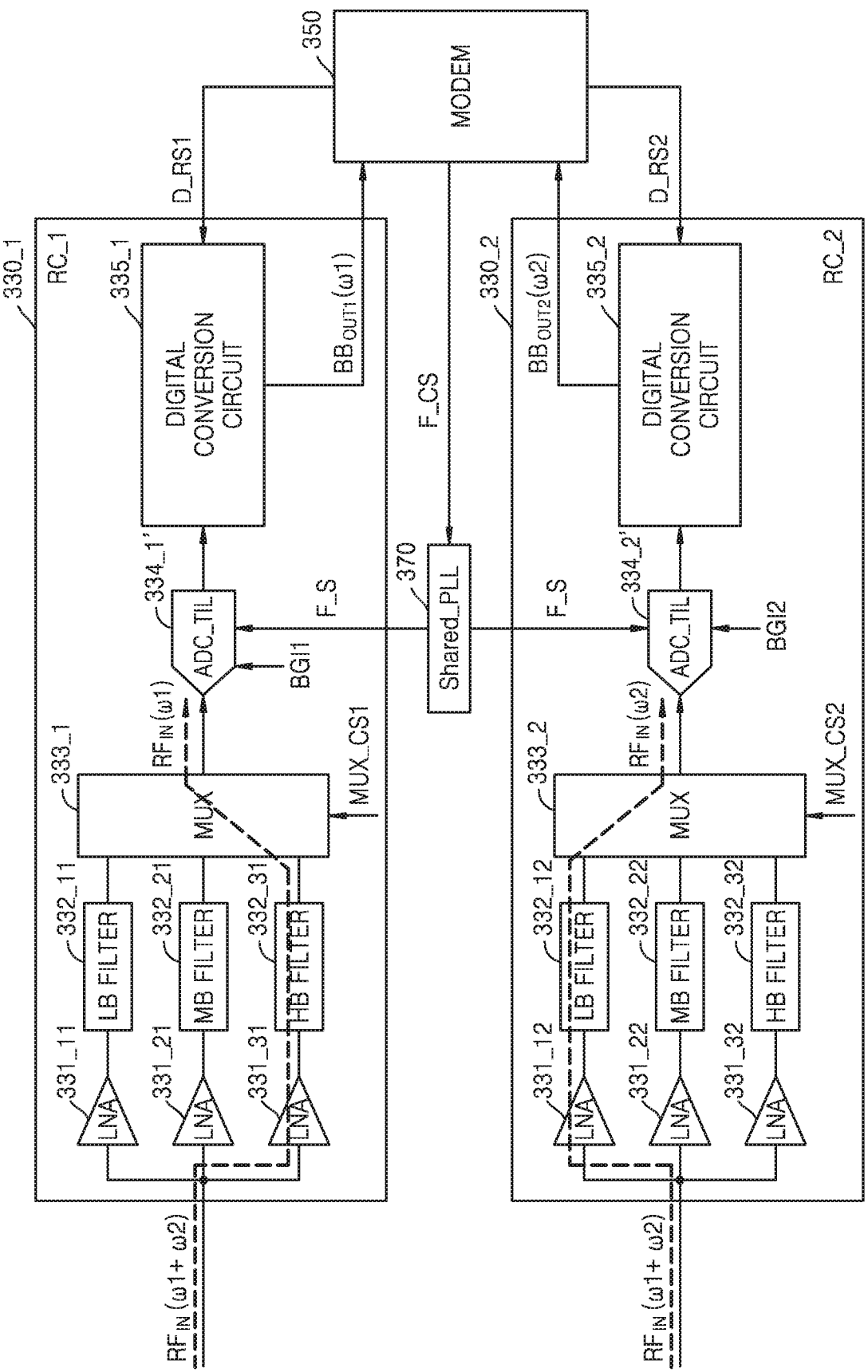
Figure 11C:
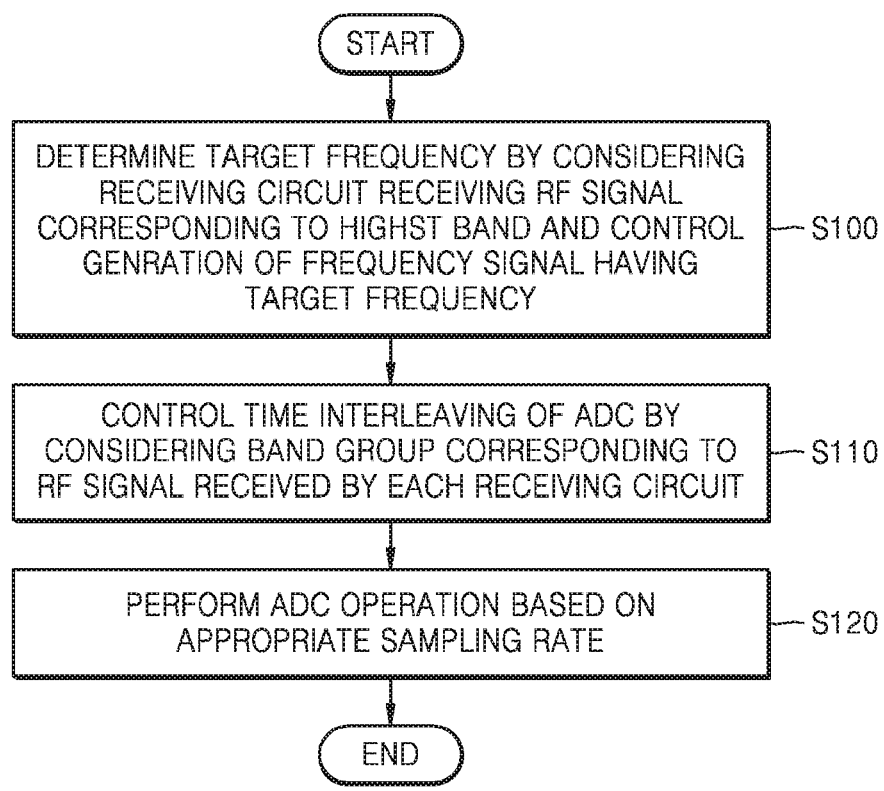
FIG. 11C is a flowchart of an example embodiment in which sampling rates are sequentially adjusted in an ADC operation of the receiving circuit.

FIGS. 11A and 11B are diagrams for explaining operations of the first and second receiving circuits 330_1 and 330_2 and the modem 350 when the inter-CA operation is performed, according to an example embodiment, and FIG. 11C is a flowchart of an example embodiment in which sampling rates are sequentially adjusted in an ADC operation of a receiving circuit.

Referring to FIG. 11A, the wireless communication device 300 may include the first receiving circuit 330_1, the second receiving circuit 330_2, and the Shared_PLL 370. The first receiving circuit 330_1 may include first through third LNAs 331_11 through 331_31, a LB filter 332_11, an MB filter 332_21, an HB filter 332_31, a MUX 333_1, an ADC 334_1, and a digital conversion circuit 335_1. The second receiving circuit 330_2 may include first through third LNAs 331_12 through 331_32, a first LB filter 332_12, an MB filter 332_22, an HB filter 332_32, a MUX 333_2, an ADC 334_2, and the digital conversion circuit 335_1. Hereinafter, the first and second receiving circuits 330_1 and 330_2 may receive the RF signal $RF_{IN}$ including signal components corresponding to a first frequency channel ω1 and a second frequency channel ω2 based on the MUX control signals MUX_CS1 and MUX_CS2 received from the modem 350, respectively. The signal component corresponding to the first frequency channel ω1 may be referred to as a signal component transmitted via a carrier located in the first frequency channel ω1, and the signal component corresponding to the second frequency channel ω2 may be referred to as a signal component transmitted via a carrier in the second frequency channel ω2. Hereinafter, it is assumed that the first frequency channel Ψ1 is included in the HB and the second frequency channel ω2 is included in the LB.

The first receiving circuit 330_1 may receive the RF signal $RF_{IN}$ corresponding to the HB, and the second receiving circuit 330_2 may receive the RF signal $RF_{IN}$ corresponding to the LB. As described above, the modem 350 may determine the target frequency based on the band group (or the HB) of the RF signal $RF_{IN}$ received by the first receiving circuit 330_1 with priority given to the first receiving circuit 330_1 and may generate the frequency control signal F_CS based on the determined target frequency. The Shared_PLL 370 may receive the frequency control signal F_CS from the modem 350 and may generate the frequency signal F_S having the target frequency based on the frequency control signal F_CS. The Shared_PLL 370 may provide the frequency signal F_S to the ADCs 334_1 and 334_2 of the first and second receiving circuits 330_1 and 330_2, respectively.

The ADC 334_1 of the first receiving circuit 330_1 may convert an analog RF signal $RF_{IN}$ including only the signal component of the first frequency channel ω1 to a digital signal by using the frequency signal F_S. The digital conversion circuit 335_1 of the first receiving circuit 330_1 may perform the frequency down conversion on the digital signal by using the first digital reference signal D_RS1 received from the modem 350. The digital conversion circuit 335_1 may extract the signal component of the first frequency channel ω1 from the RF signal $RF_{IN}$ and generate and provide a first digital baseband signal $BB_{OUT1}$(ω1) to the modem 350.

The ADC 334_2 of the second receiving circuit 330_2 may convert the analog RF signal $RF_{IN}$ including only the signal component of the second frequency channel ω2 to a digital signal by using the frequency signal F_S. The digital conversion circuit 335_2 of the second receiving circuit 330_2 may perform the frequency down conversion on the digital signal by using the second digital reference signal D_RS2 received from the modem 350. The digital conversion circuit 335_2 may extract the signal component of the second frequency channel ω2 from the RF signal $RF_{IN}$ and generate and provide a second digital baseband signal $BB_{OUT1}$ (ω2) to the modem 350.

Referring to FIG. 11B, the first and second receiving circuits 330_1 and 330_2 may include ADC_TILs 334_1' and 334_2'. The ADC_TILs 334_1' and 334_2' may receive from the modem 350 the first and second BGIs BGI1 and BGI2 corresponding to the RF signal $RF_{IN}$ received by the first and second receiving circuits 330_1 and 330_2 and may adjust the sampling rate based on the first and second BGIs BGI1 and BGI2. For example, the modem 350 may provide the ADC_TIL 334-1' with the first BGI BGI1 indicating that the first receiving circuit 330_1 receives the RF signal $RF_{IN}$ corresponding to the HB and may provide the ADC_TIL 334-2' with the second BGI BGI2 indicating that the second receiving circuit 330_2 receives the RF signal $RF_{IN}$ corresponding to the LB. The details of the ADC-TILs 334_1' and 334_2' has been described with reference to FIG. 8A and the like, and duplicate descriptions are omitted.

Referring to FIG. 11C, a modem according to an example embodiment of the inventive concept may sequentially adjust sampling rates during an ADC operation for each of a plurality of receiving circuits. Firstly, the modem may determine a target frequency of a frequency signal by considering the receiving circuit receiving an RF signal corresponding to the highest band group among the plurality of receiving circuits and may control generation of the frequency signal having the target frequency (S100). Next, the modem may control time interleaving of the ADC in the receiving circuit by considering the band group corresponding to the RF signal received by each receiving circuit (S110). As a result, the ADC included in each receiving circuit may perform the ADC operation on an analog RF signal based on an appropriate sampling rate (S120).

Figure 12A:
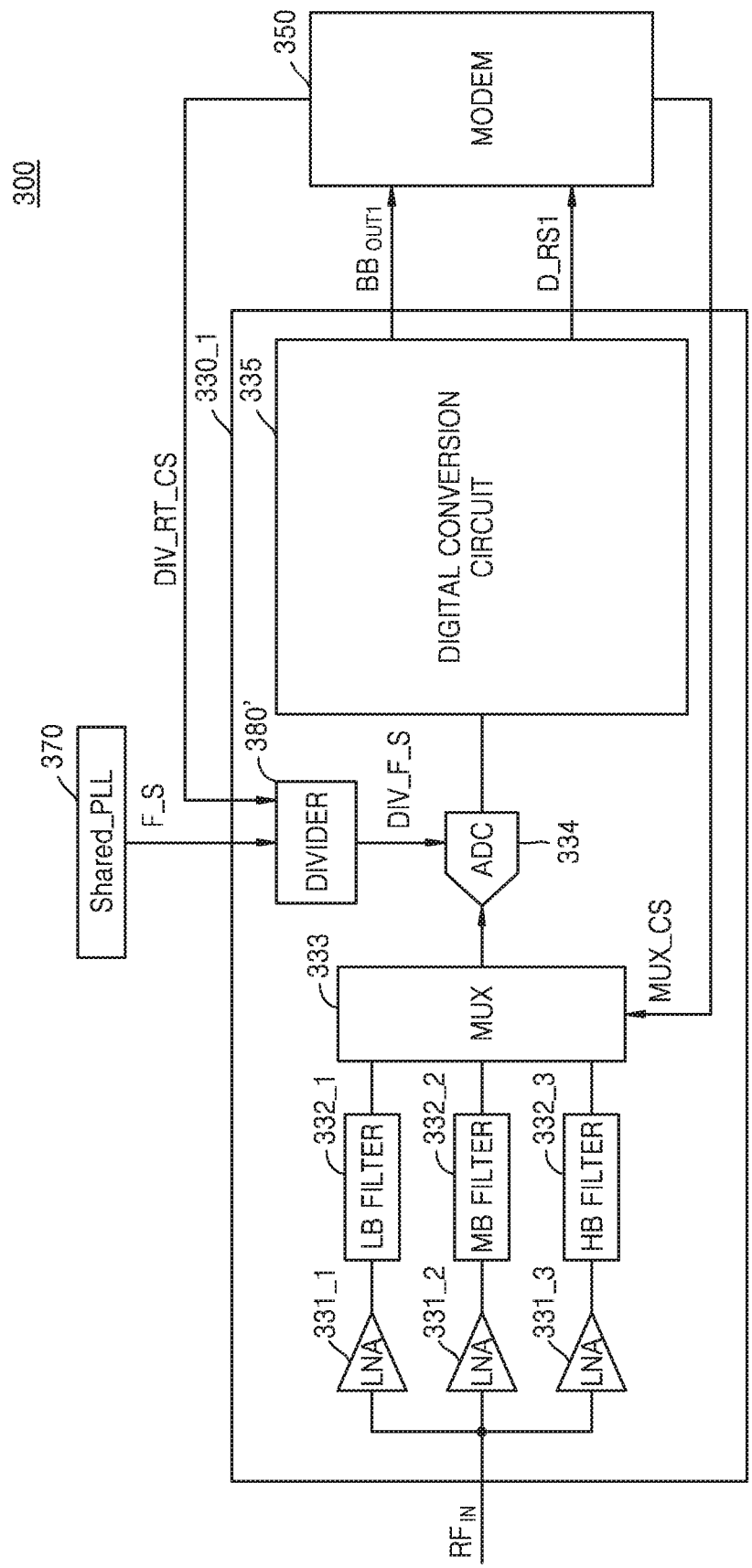
FIGS. 12A and 12B are block diagrams illustrating implementation examples of a wireless communication device in which each of the receiving circuits includes a frequency divider, according to example embodiments.
Figure 12B:
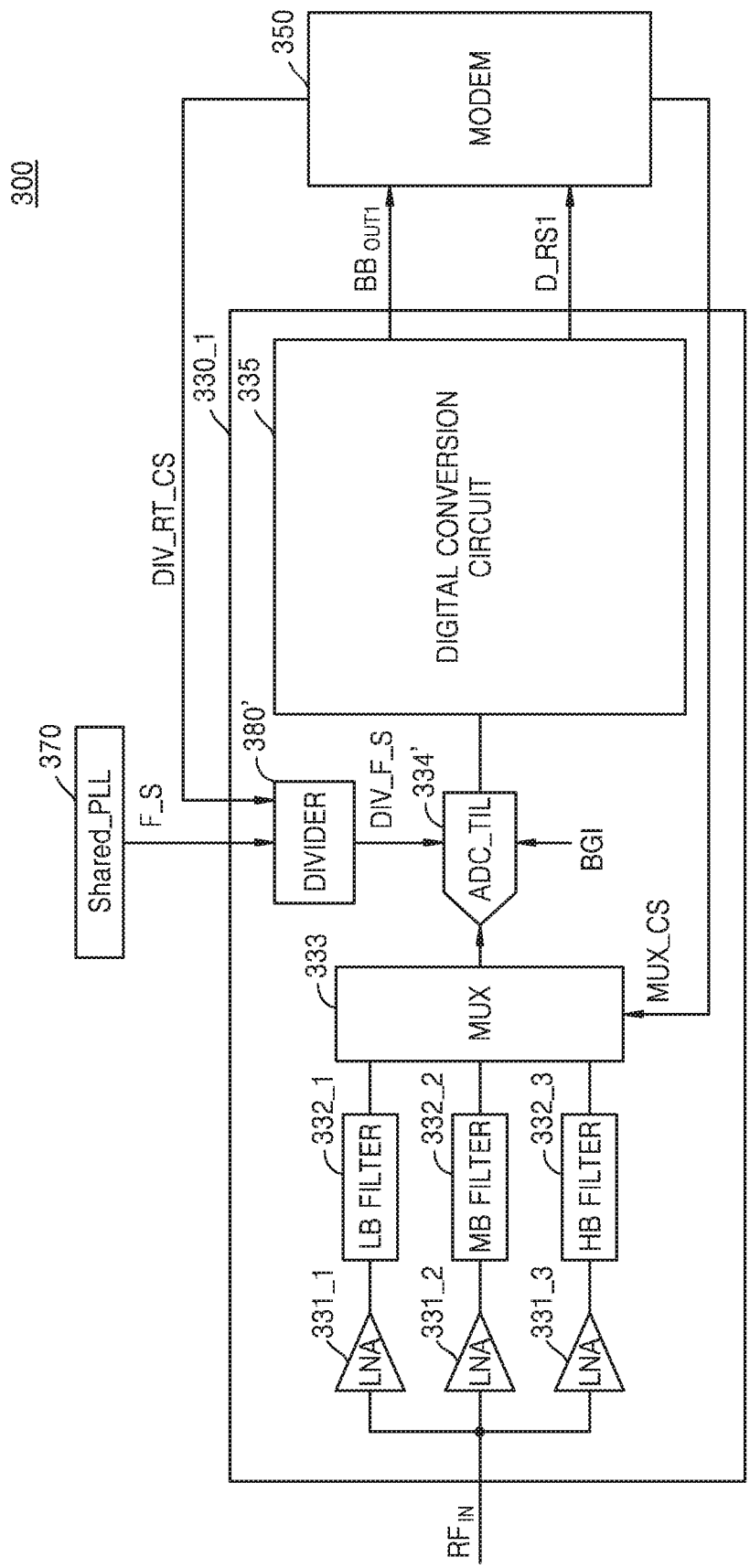

FIGS. 12A and 12B are block diagrams of implementation examples of the wireless communication device 300 in which each receiving circuit includes a frequency divider, according to example embodiments.

The first receiving circuit 330_1 in FIG. 12A may further include the frequency divider 380', in comparison with the first receiving circuit 330_1 in FIG. 5. Each of the second through $n^{th}$ receiving circuits (330_2 through 330_n in FIG. 5) may further include the frequency divider 380', like the first receiving circuit 330_1. Each of the receiving circuits in the wireless communication device 300 including the first receiving circuit 330_1 of FIG. 12A may individually include the frequency divider 380'. Hereinafter, the first receiving circuit 330_1 illustrated in FIG. 12A is described as a reference, and it may be clearly understood that the example embodiment of the first receiving circuit 330_1 is also applicable to other receiving circuits sharing the Shared_PLL 370.

The modem 350 may determine the frequency division ratio of the frequency divider 380' based on the band group corresponding to the RF signal $RF_{IN}$ received by the first receiving circuit 330_1 and may provide a frequency division ratio control signal DIV_RT_CS to the frequency divider 380'. For example, when the first receiving circuit 330_1 receives the RF signal $RF_{IN}$ corresponding to the LB, the modem 350 may determine the frequency division ratio as a first frequency division ratio. When the first receiving circuit 330_1 receives the RF signal $RF_{IN}$ corresponding to the MB, the modem may determine the frequency division ratio as a second frequency division ratio. When the first receiving circuit 330_1 receives the RF signal $RF_{IN}$ corresponding to the HB, the modem may determine the frequency division ratio as a third frequency division ratio. Magnitudes of the frequency division ratios may have a following magnitude relationship: the third frequency division ratio>the second division ratio>the first frequency division ratio. The frequency divider 380' may receive the frequency signal F_S from the Shared_PLL 370 and divide the frequency signal F_S to generate a divided frequency signal DIV_F_S. The frequency divider 380' may provide the divided frequency signal DIV_F_S to the ADC 334, and the ADC 334 may perform the ADC operation according to the sampling rate that meets the divided frequency signal DIV_F_S.

In this manner, when each of the receiving circuits are provided with an individual frequency divider, the modem 350 may provide a separate frequency division ratio control signal to each frequency divider to adjust the frequency division ratio for the frequency signal F_S, thereby adjusting the sampling rate of the ADC of each receiving circuit.

In addition, as described above, the modem 350 may determine the frequency division ratio of the frequency divider 380' based on the frequency band-related information or the frequency channel-related information corresponding to the RF signal $RF_{IN}$ received by the first receiving circuit 330_1 and may provide the frequency division ratio control signal DIV_RT_CS to the frequency divider 380'.

Referring to FIG. 12B, the first receiving circuit 330_1 may include a time interleaved ADC 334_1'. The time interleaved ADC 334_1' may receive the BGI corresponding to the RF signal $RF_{IN}$ received by the first receiving circuit 330_1 from the modem 350 and may adjust the sampling rate based on the BGI. A detailed description on this issue has been described with reference to FIG. 8A and the like, and duplicate description is omitted for conciseness.

Further, the modem 350 according to an example embodiment t may sequentially adjust the sampling rates during the ADC operation for the first receiving circuit 330_1. Firstly, the modem 350 may determine the frequency division ratio of the frequency divider 380' by considering the band group corresponding to the RF signal $RF_{IN}$ received by the first receiving circuit 330_1 and may control a frequency division operation of the frequency signal F_S according to the determined frequency division ratio. Next, the time interleaving of the time interleaved ADC 334_1' may be controlled by considering the band group corresponding to the RF signal $RF_{IN}$ received by the first receiving circuit 330_1. As a result, the time interleaved ADC 334_1' included in the first receiving circuit 330_1 may perform the ADC operation on the analog RF signal $RF_{IN}$ based on the appropriate sampling rate.

Figure 13:
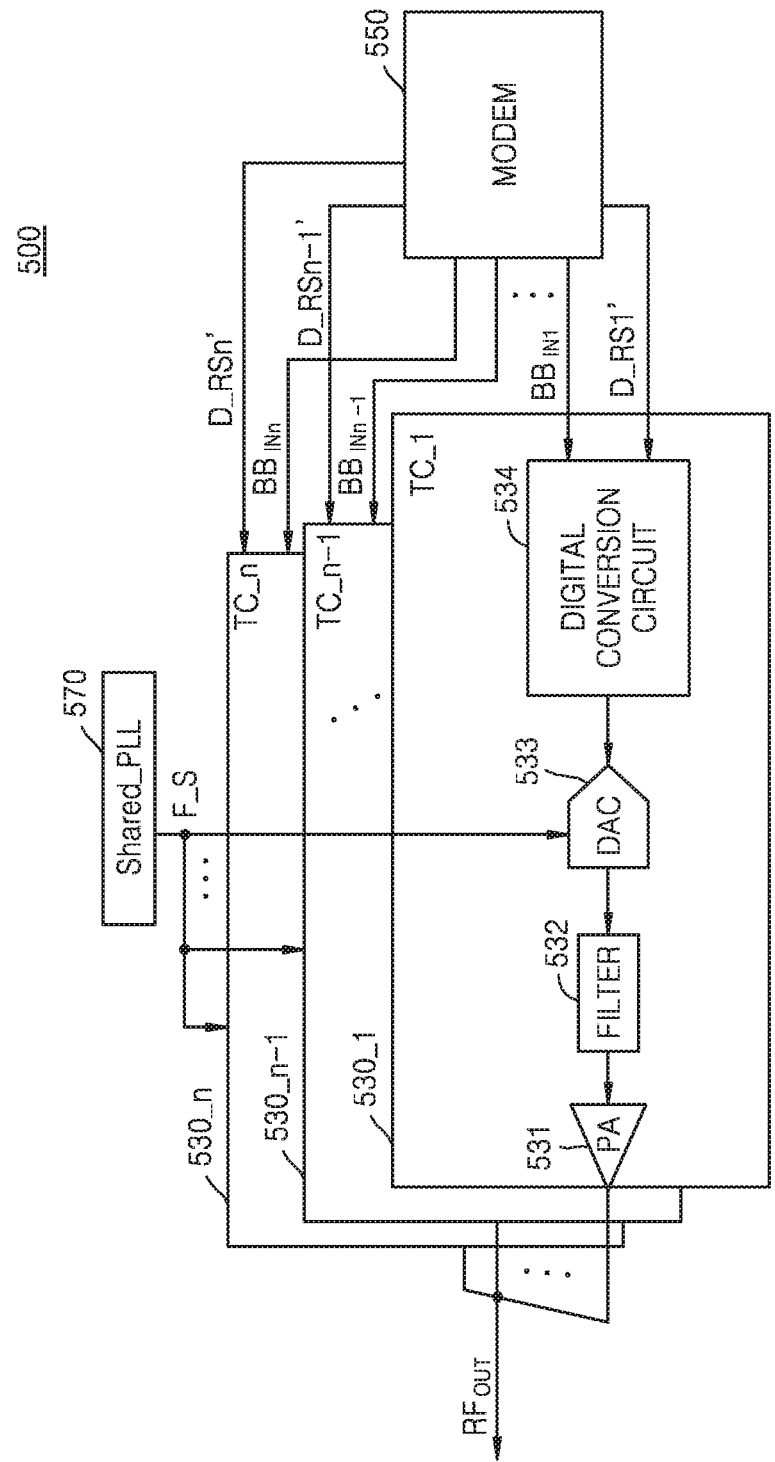
FIG. 13 is a block diagram illustrating an implementation example in which transmitting circuits of a wireless communication device share a phase locked loop circuit, according to an example embodiment.

FIG. 13 is a block diagram illustrating an implementation example in which transmitting circuits of a wireless communication device 500 share a Shared_PLL 570, according to an example embodiment Referring to FIG. 13, the wireless communication device 500 may include first through $n^{th}$ transmitting circuits 530_1 through 530_n, a modem 550, and the Shared_PLL 570. The first through $n^{th}$ transmitting circuits 530_1 through 530_n may share one Shared_PLL 570, and the first through $n^{th}$ transmitting circuits 530_1 through 530_n may receive the frequency signal F_S from the Shared_PLL 570. The first transmitting circuit 530_1 may include a power amplifier (PA) 531, a filter 532, a DAC 533, and a digital conversion circuit 534.

The digital conversion circuit 534 of the first transmitting circuit 530_1 may receive a digital baseband signal $BB_{IN1}$ and a digital reference signal D_RS1' from the modem 550 and may perform the frequency up conversion on the digital baseband signal $BB_{IN1}$ based on the digital reference signal D_RS1'. The DAC 533 may convert the digital RF signal to an analog RF signal. The first transmission circuit 530_1 may pass the analog RF signal through the filter 532 and the PA 531 and output a result thereof as an RF output signal $RF_{OUT}$. The above-described configuration of the first transmitting circuit 530_1 may be applied to the second through $n^{th}$ transmitting circuits 530_2 through 530_n. In other words, the modem 550 may provide second through $n^{th}$ digital reference signals D_RS2' through D_RSn' and second through $n^{th}$ digital baseband signals $BB_{IN2}$ through $BB_{INn}$ to second through $n^{th}$ transmitting circuits 530_2 through 530_n, respectively.

Furthermore, as described above, an example embodiment in which the wireless communication device 500 includes one frequency divider, and thus, the first through $n^{th}$ transmitting circuits 530_1 through 530_n share one frequency divider may be applicable, while an example embodiment in which each of the first through $n^{th}$ transmitting circuits 530_1 through 530_n includes one individual frequency divider may also be applicable.

Figure 14:
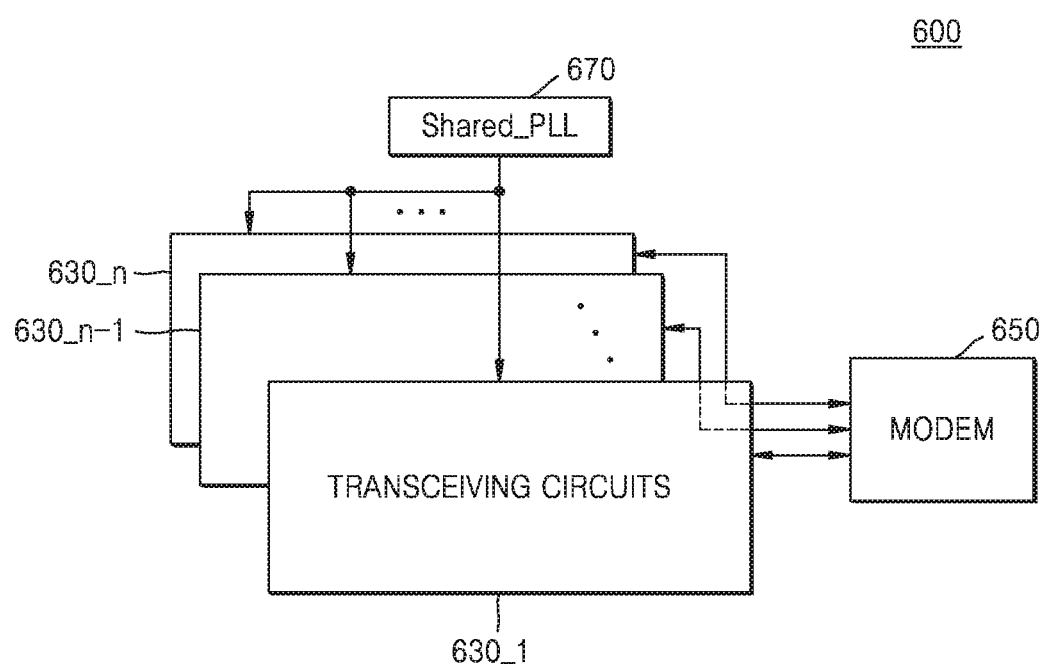
FIG. 14 is a block diagram illustrating an implementation example in which transceiving circuits of a wireless communication device share a phase locked loop circuit, according to an example embodiment.

FIG. 14 is a block diagram illustrating an implementation example in which transceiving circuits of a wireless communication device 600 share a Shared_PLL 670, according to an example embodiment.

Referring to FIG. 14, the wireless communication device 600 may include first through $n^{th}$ transceiving circuits 630_1 through 630_n, a modem 650, and the Shared_PLL 670. The first through $n^{th}$ transceiving circuits 630_1 through 630_n may share one Shared_PLL 670, and the first through $n^{th}$ transceiving circuits 630_1 through 630_n may receive the frequency signal F_S from the Shared_PLL 670.

Each of the first through $n^{th}$ transceiving circuits 630_1 through 630_n may include at least one transmitting circuit and at least one receiving circuit, and the transmitting circuit and the receiving circuit included in each of the first through $n^{th}$ transceiving circuits 630_1 through 630_n may share the Shared_PLL 670. Furthermore, as described above, an example embodiment in which the wireless communication device 600 includes one frequency divider, and thus, the first through $n^{th}$ transceiving circuits 630_1 through 630_n share one frequency divider may be applicable, while an example embodiment in which each of the first through $n^{th}$ transceiving circuits 630_1 through 630_n includes one individual frequency divider may also be applicable.

Figure 15:
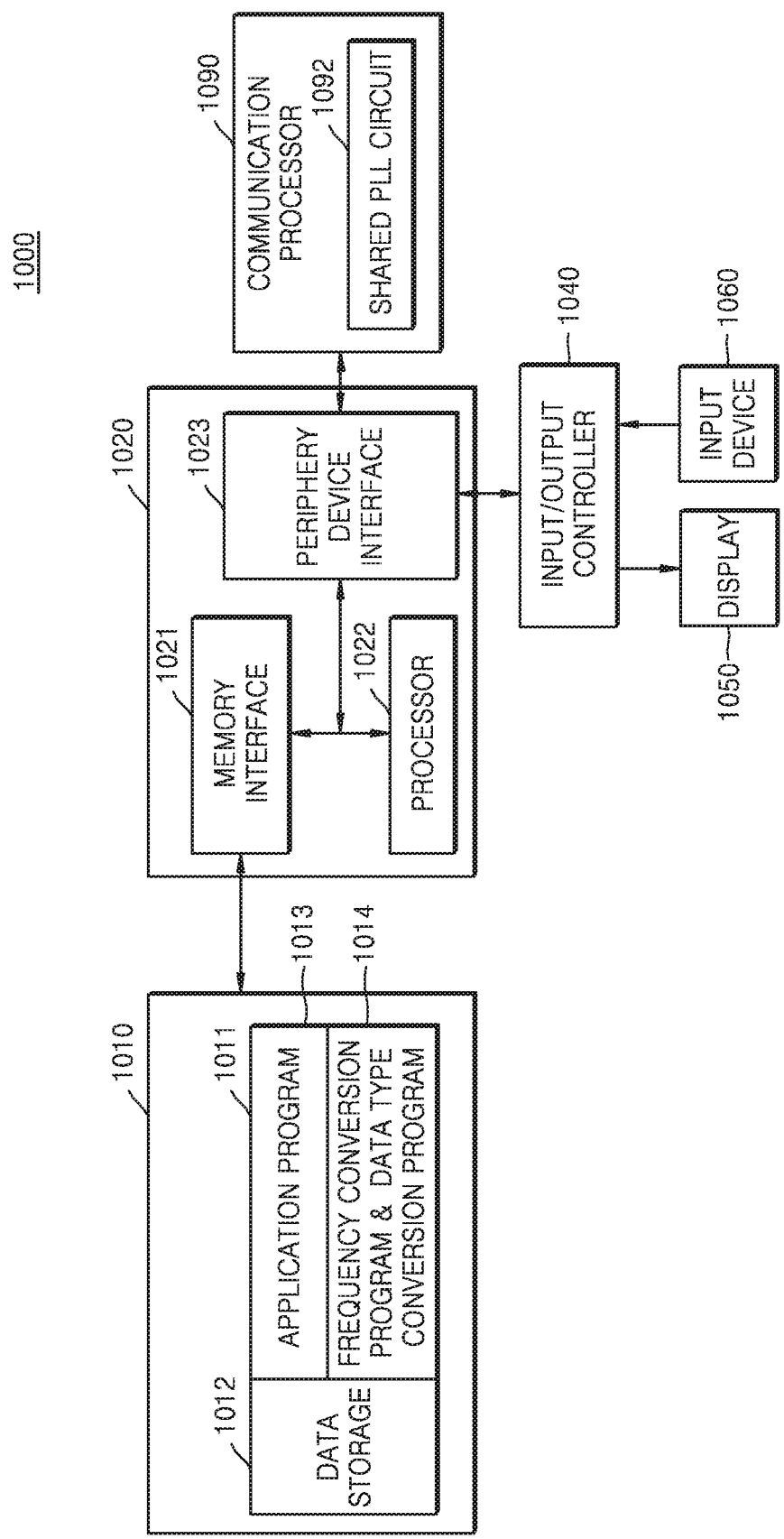
FIG. 15 is a block diagram illustrating an electronic device supporting a communication function including a beamforming function, according to an example embodiment.

FIG. 15 is a block diagram illustrating an electronic device 1000 supporting a communication function including a beamforming function, according to an example embodiment.

Referring to FIG. 15, the electronic device 1000 may include a memory 1010, a processor unit 1020, an input/output controller 1040, a display 1050, an input device 1060, and a communication processor 1090. Here, a plurality of memories 1010 may be included. Components are as follows.

The memory 1010 may include a program storage 1011 that stores programs for controlling an operation of the electronic device 1000 and a data storage 1012 that stores data generated during program execution. The data storage 1012 may store data for operations of an application program 1013 and a frequency conversion program & data type conversion program 1014. The program storage 1011 may include the application program 1013 and the frequency conversion program & data type conversion program 1014. Here, programs included in the program storage 1011 may be program code or sets of instructions and may be expressed as instruction sets.

The application program 1013 may include application programs operable in the electronic device 1000. In other words, the application program 1013 may include application instructions executed by a processor 1022. The frequency conversion program & data type conversion program 1014 may control the digital frequency down/up conversion operations of the RF signal $RF_{IN}$ and a change of the sampling rate in the ADC operation, according to the inventive concept. In other words, the frequency conversion program & data type conversion program 1014 may include instructions that are bases for a modem (or a baseband processor) of the communication processing unit 1090 to generate a digital reference signal and provide the generated digital reference signal to the receiving circuits of the communication processor 1090. The frequency conversion program & data type conversion program 1014 may include instructions that are bases for the modem of the communication processor 1090 to provide information for controlling the sampling rate when the ADCs of the receiving circuits perform the ADC operation. When the modem executes the frequency conversion program & data type conversion program 1014, operations conforming to the above-described embodiments may be performed.

A peripheral device interface 1023 may control a connection of an input/output peripheral device of a base station to the processor 1022 and the memory interface 1021. The processor 1022 may control the base station to provide an applicable service by using at least one software program. At this time, the processor 1022 may execute at least one program stored in the memory 1010 to provide a service corresponding to an applicable program.

The input/output controller 1040 may provide an interface between an input/output device such as a display 1050 and an input device 1060 and the peripheral device interface 1023. The display 1050 may display status information, input characters, moving pictures, still pictures, and the like. For example, the display 1050 may display information about an application program executed by the processor 1022.

The input device 1060 may provide input data generated by a selection of the electronic device 1000 to the processor unit 1020 via the input/output controller 1040. At this time, the input device 1060 may include a keypad including at least one hardware button and a touchpad for sensing touch information. For example, the input device 1060 may provide via the input/output controller 1040 the touch information such as a touch, a touch movement, and a touch release that has been sensed by the touch pad to the processor 1022.

The electronic device 1000 may include the communication processor 1090 that performs a communication function for voice communication and data communication. The communication processor 1090 may include a shared PLL circuit 1092 that is shared by the receiving circuits (or transmitting circuits, or transceiving circuits) described with reference to FIG. 5 and the like. The shared PLL circuit 1092 may collectively provide a frequency signal of a certain frequency to the receiving circuits (or, transmitting circuits, or transceiving circuits).

While the inventive concept has been particularly shown and described with reference to example embodiments thereof, it will be understood by one of ordinary skill in the art that various changes in form and details may be made therein without departing from the spirit and scope of the inventive concept as defined by the following claims. Accordingly, the true scope of protection of the inventive concept should be determined by the technical idea of the following claims.

What is claimed is:

1. A radio frequency (RF) integrated circuit configured to support carrier aggregation, the RF integrated circuit comprising:
    a plurality of first receiving circuits configured to connect to a first antenna; and
    a first shared phase locked loop circuit configured to provide a first frequency signal of a first frequency to the plurality of first receiving circuits,
    wherein at least one of the plurality of first receiving circuits is selected based on a carrier aggregation type to receive an RF signal from the first antenna,
    wherein one of the plurality of first receiving circuits comprises:
        an analog to digital converter (ADC) configured to convert the RF signal received by the one of the plurality of first receiving circuits to a digital signal by using the first frequency signal; and
        a digital conversion circuit configured to generate a digital baseband signal by performing frequency down conversion on the digital signal,
    wherein a sampling rate of the RF signal of the ADC is determined according to a band group corresponding to the RF signal, and
    wherein the ADC comprises a plurality of ADC circuits, each configured to receive the first frequency signal and configured to perform a sampling operation by providing the RF signal with a time difference to at least one ADC circuit among the plurality of ADC circuits based on the band group corresponding to the RF signal.

2. The RF integrated circuit of claim 1, wherein the first frequency is determined according to the band group corresponding to the RF signal received by the one of the plurality of first receiving circuits.

3. The RF integrated circuit of claim 2, wherein the band group comprises a plurality of band groups corresponding to the RF signal, and the first frequency is determined based on a highest band group among the plurality of band groups.

4. The RF integrated circuit of claim 1, wherein the one of the plurality of first receiving circuits further comprises a frequency divider configured to receive the first frequency signal, divide the first frequency signal, and provide the first frequency signal that has been divided to the ADC.

5. The RF integrated circuit of claim 4, wherein a frequency division ratio of the frequency divider is determined according to the band group corresponding to the RF signal.

6. The RF integrated circuit of claim 1, further comprising:
    a plurality of second receiving circuits configured to connect to a second antenna; and
    a second shared phase locked loop circuit configured to provide a second frequency signal of a second frequency to the plurality of second receiving circuits,
    at least one of the plurality of second receiving circuits is selected based on the carrier aggregation type to receive an RF signal from the second antenna.

7. The RF integrated circuit of claim 1, further comprising:
    a plurality of second receiving circuits configured to connect to a second antenna; and
    a frequency divider configured to receive the first frequency signal from the first shared phase locked loop circuit, divide the first frequency signal, and provide the first frequency signal that has been divided to the plurality of second receiving circuits,
    at least one of the plurality of second receiving circuits is selected based on the carrier aggregation type to receive an RF signal from the second antenna.

8. The RF integrated circuit of claim 1, further comprising:
    a plurality of transmitting circuits; and
    a second shared phase locked loop circuit configured to provide a second frequency signal of a second frequency to the plurality of transmitting circuits,
    wherein one of the plurality of transmitting circuits comprises:
    a digital conversion circuit configured to up convert the digital baseband signal that has been received and generate a digital output signal; and
    a digital to analog converter (DAC) configured to convert the digital output signal to an analog signal by using the second frequency signal.

9. The RF integrated circuit of claim 1, further comprising a plurality of transmitting circuits, wherein the first shared phase locked loop circuit is configured to provide the first frequency signal to the plurality of transmitting circuits.

10. A wireless communication device configured to support carrier aggregation, the wireless communication device comprising:
    a radio frequency (RF) integrated circuit comprising:
        a plurality of receiving circuits configured to connect to an antenna and receive an RF signal from the antenna; and
        a shared phase locked loop circuit configured to provide to the plurality of receiving circuits a frequency signal of a certain frequency for an analog to digital conversion; and
    a modem configured to provide, to the RF integrated circuit, a digital reference signal for frequency down conversion of the RF signal,
    wherein at least one of the plurality of receiving circuits is selected based on a carrier aggregation type to receive the RF signal.

11. The wireless communication device of claim 10, wherein one of the plurality of receiving circuits comprises:
    an analog to digital converter (ADC) configured to convert the RF signal that is received to a digital signal based on the frequency signal; and
    a digital conversion circuit configured to frequency down convert the digital signal based on the digital reference signal and generate a digital baseband signal.

12. The wireless communication device of claim 11, wherein the modem is configured to receive the digital baseband signal from the digital conversion circuit and process the digital baseband signal.

13. The wireless communication device of claim 11, wherein the modem is configured to provide, to the ADC, band group information about a band group corresponding to the RF signal, and the ADC is configured to determine a sampling rate based on the band group information, and convert the RF signal to the digital signal according to the sampling rate.

14. The wireless communication device of claim 10, wherein:
the RF integrated circuit further comprises a frequency divider configured to receive the frequency signal from the shared phase locked loop circuit, divide the frequency signal, and provide the frequency signal that has been divided to the plurality of receiving circuits, and
the modem is configured to control a frequency division ratio of the frequency divider based on a highest band group among two or more band groups corresponding to the RF signal.

15. The wireless communication device of claim 10, wherein:
one of the plurality of receiving circuits comprises a frequency divider configured to receive the frequency signal, divide the frequency signal, and generate a divided frequency signal for the analog to digital conversion, and
the modem is configured to control a division ratio of the frequency divider based on a base group corresponding to the RF signal.

16. The wireless communication device of claim 10, wherein the RF integrated circuit further comprises a plurality of transmitting circuits transmitting the RF signal, and the shared phase locked loop circuit is configured to provide to the plurality of transmitting circuits the frequency signal for digital to analog conversion.

17. The wireless communication device of claim 16, wherein one of the plurality of transmitting circuits comprises:
a digital conversion circuit configured to frequency up convert a digital baseband signal received by the modem and generate a digital output signal; and
a digital to analog converter (DAC) configured to convert the digital output signal to an analog signal by using the frequency signal.

18. A non-transitory processor readable storage medium comprising commands, which, when executed by a processor inside a wireless communication device comprising a plurality of receiving circuits that share one phase locked loop circuit, the processor is configured to provide, to the plurality of receiving circuits, a digital-reference signal for a frequency down conversion of a radio frequency (RF) signal received by the plurality of receiving circuits based on a frequency channel corresponding to the RF signal, and to provide to the plurality of receiving circuits a signal for adjusting a sampling rate at a time of an analog to digital conversion performed by the plurality of receiving circuits based on a band group corresponding to the RF signal,
wherein the plurality of receiving circuits are configured to connect to an antenna, and
wherein at least one of the plurality of receiving circuits is selected based on a carrier aggregation type to receive the RF signal from the antenna.

* * * * *